(12) United States Patent
Kim et al.

(10) Patent No.: US 10,797,228 B2
(45) Date of Patent: Oct. 6, 2020

(54) MAGNETORESISTIVE RANDOM ACCESS MEMORY DEVICE

(71) Applicant: SAMSUNG ELECTRONICS CO., LTD., Suwon-si, Gyeonggi-do (KR)

(72) Inventors: Woo-Jin Kim, Hwaseong-si (KR); Shin-Hee Han, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 5 days.

(21) Appl. No.: 16/366,136

(22) Filed: Mar. 27, 2019

(65) Prior Publication Data

US 2020/0098977 A1  Mar. 26, 2020

(30) Foreign Application Priority Data

Sep. 20, 2018 (KR) ........................ 10-2018-0113258

(51) Int. Cl.
*H01L 29/82* (2006.01)
*H01L 43/02* (2006.01)
(Continued)

(52) U.S. Cl.
CPC ............ *H01L 43/02* (2013.01); *H01L 27/222* (2013.01); *H01L 43/12* (2013.01); *H01L 43/10* (2013.01)

(58) Field of Classification Search
CPC .... G06F 3/0679; G06F 3/0659; G06F 3/0619; G06F 12/0246; G06F 13/1668; G06F 3/064; G06F 3/0656; G06F 3/0688; G06F 11/1068; G06F 3/0604; G06F 3/0631; G06F 11/076; G06F 11/10; G06F 11/1048; G06F 11/1076; G06F 11/3037; G06F 12/0253; G06F 12/0292; G06F 12/1009; G06F 16/9535; G06F 2212/7201; G06F 3/061; G06F 3/0611; G06F 3/0614; G06F 3/0629; G06F 3/0658; G11C 16/26; G11C 11/5642; G11C 16/10; G11C 11/161; G11C 11/5628; G11C 16/0483; G11C 13/0069; G11C 16/0466; G11C 16/16; G11C 16/3495; G11C 29/52; G11C 11/4074;
(Continued)

(56) References Cited

U.S. PATENT DOCUMENTS 8,686,392 B2  4/2014  Tsukamoto
9,595,561 B2  3/2017  Lee
(Continued)

FOREIGN PATENT DOCUMENTS

JP       5703041 B2       2/2015
KR   10-2014-0022245 A   2/2014
KR   10-2017-0029809 A   3/2017

*Primary Examiner* — Robert G Bachner
(74) *Attorney, Agent, or Firm* — Lee IP Law, P.C.

(57) ABSTRACT

A MRAM device includes a first insulating interlayer on a substrate including a cell region and a peripheral region, lower electrode contacts extending through the first insulating interlayer of the cell region, a first structure on each of the lower electrode contacts, the first structure including a lower electrode, a magnetic tunnel junction structure, and an upper electrode sequentially stacked, and a capping layer covering surfaces of the first insulating interlayer and the first structure in the cell and peripheral regions, wherein an upper surface of the capping layer on the first insulating interlayer in the peripheral region is higher than an upper surface of the capping layer on the first insulating interlayer between the first structures in the cell region.

20 Claims, 30 Drawing Sheets

(51) Int. Cl.
  *H01L 27/22* (2006.01)
  *H01L 43/12* (2006.01)
  *H01L 43/10* (2006.01)

(58) Field of Classification Search
  CPC ............ G11C 11/4076; G11C 11/4085; G11C 11/4091; G11C 13/0004; G11C 13/003; G11C 13/004; G11C 16/08; G11C 16/24; G11C 16/30; G11C 16/3404; G11C 16/3418; G11C 16/3459; G11C 2013/0078; G11C 2207/2254; G11C 29/42; H01L 43/08; H01L 43/12; H01L 43/02; H01L 27/222; H01L 43/10; H01L 27/228; H01L 27/1157; H01L 27/11582; H01L 45/06; H01L 45/141; H01L 21/02126; H01L 21/02167; H01L 21/0217; H01L 21/02175; H01L 21/02211; H01L 21/02274; H01L 21/0228; H01L 21/0234; H01L 21/02348; H01L 21/28568; H01L 21/31144; H01L 21/32139; H01L 21/56; H01L 21/743; H01L 21/76895; H01L 2224/16225; H01L 23/291; H01L 23/485; H01L 23/5226; H01L 23/535; H01L 27/105; H01L 27/1104; H01L 27/11519; H01L 27/11524; H01L 27/11529; H01L 27/11556; H01L 27/11565; H01L 27/11573; H01L 27/2427; H01L 27/2463; H01L 27/2481; H01L 27/3218; H01L 28/00; H01L 28/10; H01L 2924/15311; H01L 2924/181; H01L 29/41791; H01L 29/42348; H01L 29/66795; H01L 29/7851; H01L 29/7923; H01L 29/82; H01L 41/0933; H01L 43/04; H01L 43/06; H01L 45/04; H01L 45/1233; H01L 45/126; H01L 45/144; H01L 45/16; H01L 45/1675; H01L 45/1683; H01L 51/5206; G06N 20/00; G06N 3/04; G06N 5/04; G06N 3/0454; G06N 3/08; G06N 3/10; G06K 2209/01; G06K 9/00979; G06K 2209/27; G06K 9/00281; G06K 9/00449; G06K 9/00604; G06K 9/00664; G06K 9/00671; G06K 9/00791; G06K 9/00798; G06K 9/00805; G06K 9/00812; G06K 9/00832; G06K 9/00845; G06K 9/6256; G06K 9/6296; G06K 9/66
  See application file for complete search history.

(56) References Cited

U.S. PATENT DOCUMENTS

| | | |
|---|---|---|
| 9,704,919 B1 | 7/2017 | Lu et al. |
| 9,853,087 B2 | 12/2017 | Suh et al. |
| 9,985,075 B2 | 5/2018 | Chuang et al. |
| 2018/0006085 A1 | 1/2018 | Chuang et al. |
| 2018/0012933 A1 | 1/2018 | Suh et al. |
| 2018/0097173 A1 | 4/2018 | Chuang et al. |
| 2018/0159023 A1 | 6/2018 | Suh et al. |

MAGNETORESISTIVE RANDOM ACCESS MEMORY DEVICE

CROSS-REFERENCE TO RELATED APPLICATION

Korean Patent Application No. 10-2018-0113258, filed on Sep. 20, 2018, in the Korean Intellectual Property Office (KIPO), and entitled: "A Magnetoresistive Random Access Memory Device," is incorporated by reference herein in its entirety.

BACKGROUND

1. Field

Example embodiments relate to a semiconductor device. More particularly, example embodiments relate to a magnetoresistive random access memory (MRAM) device.

2. Description of the Related Art

When a MRAM device is manufactured, a magnetic tunnel junction (MTJ) layer may be etched to form a MTJ structure in a cell region. Due to the etching process, however, differences between the cell region and a peripheral region may occur.

SUMMARY

According to example embodiments, there is provided a MRAM device. The MRAM device may include a first insulating interlayer, lower electrode contacts, a first structure and a capping layer. The first insulating interlayer may be foamed on a substrate including a cell region and a peripheral region. The lower electrode contacts may extend through the first insulating interlayer of the cell region. The first structure may contact on each of the lower electrode contacts. The first structure may include a lower electrode, a magnetic tunnel junction structure and an upper electrode sequentially stacked. The capping layer may cover surfaces of the first insulating interlayer and the first structure in the cell and peripheral regions. An upper surface of the capping layer on the first insulating interlayer in the peripheral region may be higher than an upper surface of the capping layer on the first insulating interlayer between the first structures in the cell region.

According to example embodiments, there is provided a MRAM device. The MRAM device may include a first insulating interlayer, lower electrode contacts, and a first structure. The first insulating interlayer may be formed on a substrate including a cell region and a peripheral region. The lower electrode contact may extend through the first insulating interlayer of the cell region. The first structure may be contact on each of the lower electrode contacts. The first structure may include a lower electrode, a magnetic tunnel junction structure and an upper electrode sequentially stacked. An upper surface of the first insulating interlayer in the peripheral region may be higher than an upper surface of the first insulating interlayer between the first structures in the cell region.

According to example embodiments, there is provided a MRAM device. The MRAM device may include a first insulating interlayer, lower electrode contacts, a first structure and a capping layer. The first insulating interlayer may be formed on a substrate including a cell region and a peripheral region. The lower electrode contacts may extend through the first insulating interlayer of the cell region. The first structure may contact on each of the lower electrode contacts. The first structure including a lower electrode, a magnetic tunnel junction structure and an upper electrode sequentially stacked. The capping layer may cover surfaces of the first insulating interlayer and the first structure in the cell and peripheral region. The capping layer may have a uniform thickness. An upper surface the first insulating interlayer in the cell region may be lower than an upper surface the first insulating interlayer in the peripheral region.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
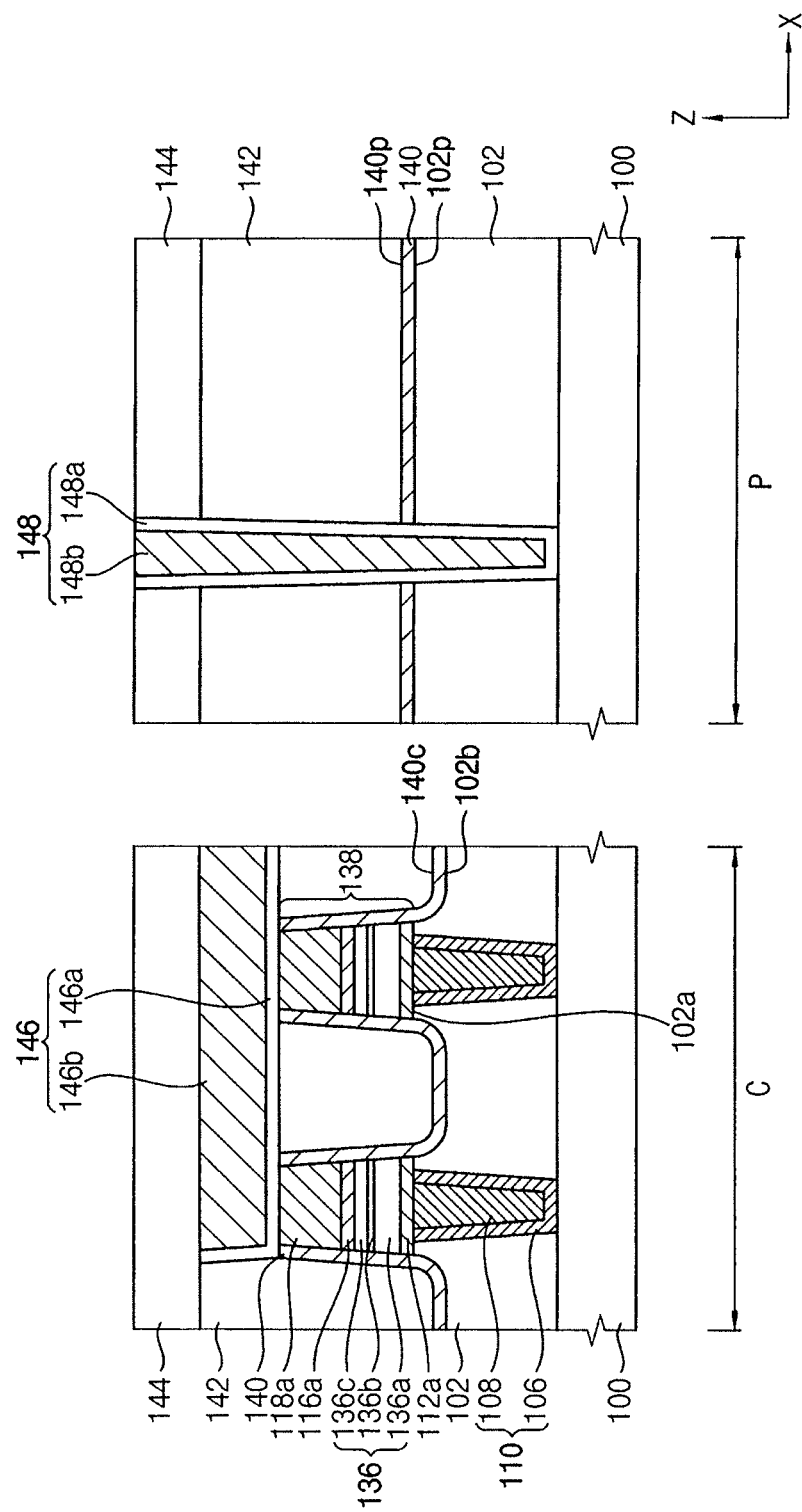
FIG. 1 illustrates a cross-sectional view of a MRAM device in accordance with example embodiments.

FIG. 1 is a cross-sectional view illustrating a MRAM device in accordance with example embodiments.

Referring to FIG. 1, the MRAM device may be formed on a substrate 100 including a cell region C and a peripheral region P. A first insulating interlayer 102, a lower electrode contact 110, a lower electrode 112*a*, an MTJ structure 136, a middle electrode 116*a*, and an upper electrode 118*a* may be formed on the substrate 100 of the cell region C. The first insulating interlayer 102 may be formed on the substrate 100 of the peripheral region P. Also, a first capping layer 140 may be formed on a surface of a first structure 138 including the lower electrode 112*a*, the MTJ structure 136, the middle electrode 116*a*, and the upper electrode 118*a* and a surface of the first insulating interlayer 102. The MRAM may further include a second insulating interlayer 142, a bit line 146, a third insulating interlayer 144, and a via contact 148.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be a silicon-on-insulator (SOI) substrate or a germanium-on-insulator (GOI) substrate. Various types of circuit patterns, e.g., transistors, lower wirings, etc., and a lower insulating interlayer covering the circuit patterns may be further formed on the substrate 100.

The first insulating interlayer 102 may be on the substrate 100. The first insulating interlayer 102 may include silicon oxide, or a low-k dielectric material having a dielectric constant less than that of silicon oxide, i.e., less than about 3.9.

The lower electrode contact 110 may fill a first opening extending through the first insulating interlayer 102, e.g., along the Z direction, in the cell region C. In example embodiments, the lower electrode contact 110 may include a first barrier pattern 106 and a first conductive pattern 108. The first barrier pattern 106 may include a metal nitride, e.g., tungsten nitride, tantalum nitride, titanium nitride, etc., or a metal, e.g., tantalum, titanium, etc. The first conductive pattern 108 may include a metal having a low resistance, e.g., tungsten, copper, aluminum, etc. The lower electrode contact 110 may contact the substrate 100 or a lower wiring on the substrate 100.

The first structure 138 may include the lower electrode 112a, the MTJ structure 136, and the middle electrode 116a sequentially stacked. The first structure 138 may have a pillar structure. The first structure 138 may contact an upper surface of the lower electrode contact 110. Thus, the first structure 138 may be formed on the cell region C. The first structure 138 may not be formed on the peripheral region P. In some embodiments, the first structure 138 may not include the middle electrode.

In example embodiments, a sidewall of the first structure 138 may have a slope so that a width of the first structure 138 may be gradually increased in a downward direction, e.g., a width of the first structure 138 may be gradually increased in the X direction as a distance from the substrate 100 along the Z direction decreases. Alternatively, the sidewall of the first structure 138 may have a vertical slope.

In example embodiments, the first structure 138 may completely cover the upper surface of the lower electrode contact 110, and the first structure 138 may cover, e.g., a first portion 102a of an upper surface of, the first insulating interlayer 102 adjacent to the lower electrode contact 110. In example embodiments, an upper surface of the first insulating interlayer 102, e.g., a second portion 102b of the upper surface of the first insulating interlayer 102, between the first structures 138 may be lower than the upper surface of the lower electrode contact 110.

An upper surface 102p of the first insulating interlayer 102 in the peripheral region P may be higher than the second portion 102b of the upper surface of the first insulating interlayer 102 between the first structures 138. The upper surface 102p of the first insulating interlayer 102 in the peripheral region P may be substantially flat. In example embodiments, the upper surface 102p of the first insulating interlayer 102 in the peripheral region P may be substantially coplanar with or lower than the upper surface of the lower electrode contact 110.

That is, a height of the upper surface 102p of the first insulating interlayer 102 in the peripheral region P may be higher than a height of the second portion 12b of the upper surface of the first insulating interlayer 102 between the first structures 138 in the cell region C. Thus, a step difference between the cell region C where the first structure 138 is formed and the peripheral region P where the first structure 138 is not formed may decrease.

The lower electrode 112a may be on the lower electrode contact 110. The lower electrode 112a may include a metal nitride, e.g., tantalum nitride, titanium nitride, etc., or a metal, e.g., tantalum, titanium, etc.

The MTJ structure 136 may be on the lower electrode 112a. The MTJ structure 136 may include a first magnetic pattern 136a, a tunnel barrier pattern 136b, and a second magnetic pattern 136c sequentially stacked.

In example embodiments, the first magnetic pattern 136a may serve as a fixed layer having a fixed magnetization direction. In example embodiments, the first magnetic pattern 136a may include a fixed pattern, a lower ferromagnetic pattern, an anti-ferromagnetic coupling spacer pattern, and an upper ferromagnetic pattern. In this case, the fixed pattern may include, e.g., FeMn, IrMn, PtMn, MnO, MnS, MnTe, $MnF_2$, $FeF_2$, $FeCl_2$, FeO, $CoCl_2$, CoO, $NiCl_2$, NiO, and/or Cr, etc. The lower and upper ferromagnetic patterns may include a ferromagnetic material, e.g., Fe, Ni, and/or Co. The anti-ferromagnetic coupling spacer pattern may include, e.g., Ru, Ir, and/or Rh.

In example embodiments, the second magnetic pattern 136c may serve as a free layer having a changeable magnetization direction. In this case, the second magnetic pattern 136c may include a ferromagnetic material, e.g., Fe, Ni, Co, Cr, Pt, etc. The second magnetic pattern 136c may further include, e.g., boron, silicon, etc. The second magnetic pattern 136c may include at least one of the ferromagnetic materials. For example, the second magnetic pattern 136c may include, e.g., CoFe, NiFe, FeCr, CoFeNi, PtCr, CoCrPt, CoFeB, NiFeSiB, CoFeSiB, etc.

The tunnel barrier pattern 136b may be disposed between the first and second magnetic patterns 136a and 136c. Thus, the first and second magnetic patterns 136a and 136c may not directly contact each other. In example embodiments, the tunnel barrier pattern 136b may include a metal oxide having an insulating material, e.g., aluminum oxide or magnesium oxide.

In example embodiments, the middle electrode 116a may include a metal nitride, e.g., tantalum nitride, titanium nitride, etc., or a metal, e.g., tantalum, titanium, etc. The upper electrode 118a may include a metal, e.g., tungsten, Cu, Pt, Ni, Ag, Au, etc. For example, the upper electrode 118a may include tungsten.

The first capping layer 140 may be conformally formed on the surfaces of the first structure 138 and the first insulating interlayer 102. For example, as illustrated in FIG. 1, the first capping layer 140 may include a horizontal portion, e.g., along the X direction, on the first insulating interlayer 102, and a vertical portion extending from the horizontal portion along sidewalls of the first structure 138, e.g., along the Z direction. The first capping layer 140 may have a substantially uniform thickness. The first capping layer 140 may contact the sidewall of the first structure 138, so that the first capping layer 140 may protect the first structure 138. The first capping layer 140 may include, e.g., silicon nitride or silicon oxynitride.

An upper surface 140p of the first capping layer 140 formed on the first insulating interlayer 102 in the peripheral region P may be higher than an upper surface 140c of the first capping layer 140 formed on the first insulating interlayer 102 in the cell region C. That is, the upper surface 140p of the first capping layer 140 in the peripheral region P may be higher, e.g., along the Z direction relative to the substrate 100, than a lowest portion, i.e., the horizontal portion on the first insulating interlayer 102, of the first capping layer 140 in the cell region C.

The second insulating interlayer 142 may be formed on the first capping layer 140 to fill a gap between the first structures 138. The second insulating interlayer 142 may include an oxide, e.g., silicon oxide.

As the upper surface 102p of the first insulating interlayer 102 in the peripheral region P is relatively high, i.e., along the Z direction relative to the substrate 100, a step difference between the cell region C where the first structure 138 is formed and the peripheral region P where the first structure 138 is not formed may decrease. Thus, a step difference between upper surfaces of the second insulating interlayer 142 in the cell region C and the peripheral region P may decrease. In example embodiments, the upper surfaces of the second insulating interlayer 142 in the cell region C and the peripheral region P may be coplanar with each other.

The bit line 146 may contact an upper surface of the upper electrode 118a through the second insulating interlayer 142. In example embodiments, the bit line 146 may extend in one direction to have a line shape. The bit line 146 may include a second barrier pattern 146a and a second metal pattern 146b.

The second barrier pattern 146a may include, e.g., a metal nitride such as tungsten nitride, tantalum nitride, titanium nitride, and/or a metal such as tantalum, titanium. The second metal pattern 146b may include, e.g., tungsten, copper, aluminum, etc.

The third insulating interlayer 144 may be formed on the second insulating interlayer 142. The via contact 148 may contact the substrate 100 or a lower wiring on the substrate 100 extending through the third insulating interlayer 144, the second insulating interlayer 142, the first capping layer 140, and the first insulating interlayer 102. In example embodiments, upper wirings may be further formed on the via contact 148.

In example embodiments, the second and third insulating interlayers 142 and 144 may include substantially the same material, and thus may be merged into one insulating interlayer.

A step difference between the second insulating interlayers 142 in the cell region C and the peripheral region P and a step difference between the third insulating interlayers 144 in the cell region C and the peripheral region P may decrease, respectively. Thus, variation and failures of photolithography process for forming the via contact 148 and the upper wirings may decrease. Therefore, failures of the via contact 148 and the upper wirings may be reduced.

FIGS. 2 to 13 are cross-sectional views illustrating stages in a method of manufacturing a MRAM device in accordance with example embodiments.

Figure 2:
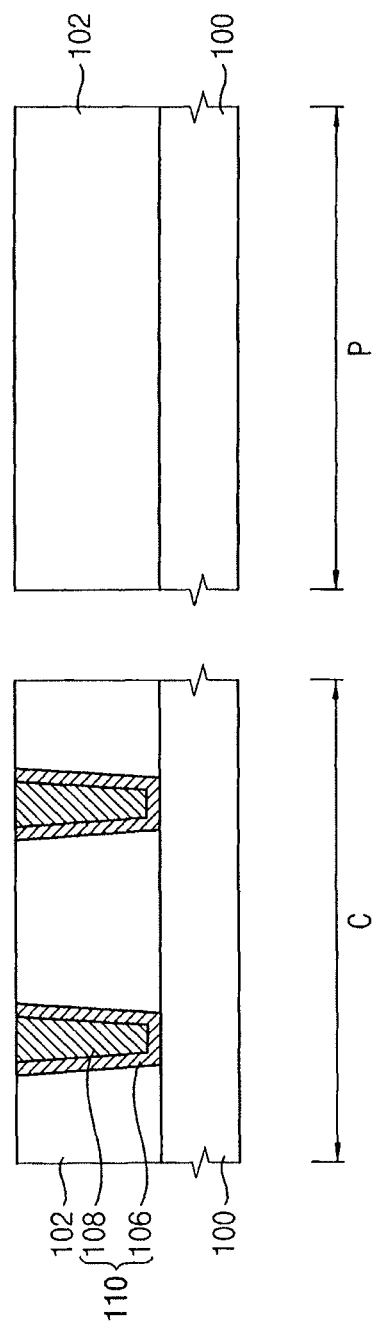
FIGS. 2 to 13 illustrate cross-sectional views of stages in a method of manufacturing a MRAM device in accordance with example embodiments.

Referring to FIG. 2, the first insulating interlayer 102 may be formed on the substrate 100 including the cell region C and the peripheral region P. The lower electrode contact 110 may be formed through the first insulating interlayer 102 in the cell region C. In example embodiments, circuit patterns including, e.g., a transistor, and a lower wiring, etc., may be further formed between the substrate 100 and the first insulating interlayer 102. Also, a lower insulating interlayer may be further formed to cover the circuit patterns.

In example embodiments, the lower electrode contact 110 may be formed only on the cell region C. For example, the lower electrode contact 110 may be electrically connected to the substrate 100 or a lower wiring formed on the substrate 100.

For example, an etching mask may be formed on the first insulating interlayer 102. The first insulating interlayer 102 may be anisotropically etched using the etching mask to form a first opening exposing an upper surface of the substrate 100. The anisotropic etching process may include a chemical etching process, e.g., a reactive ion etching (RIE) process.

A first barrier layer may be formed on an inner surface of the first opening and the upper surface of the first insulating interlayer 102. A first conductive layer may be formed on the first barrier layer to fill the first opening. The first barrier layer and the first conductive layer may be planarized until an upper surface of the first insulating interlayer 102 is exposed to form the lower electrode contact 110 filling the first opening. The lower electrode contact 110 may include the first barrier pattern 106 and the first conductive pattern 108.

Figure 3:
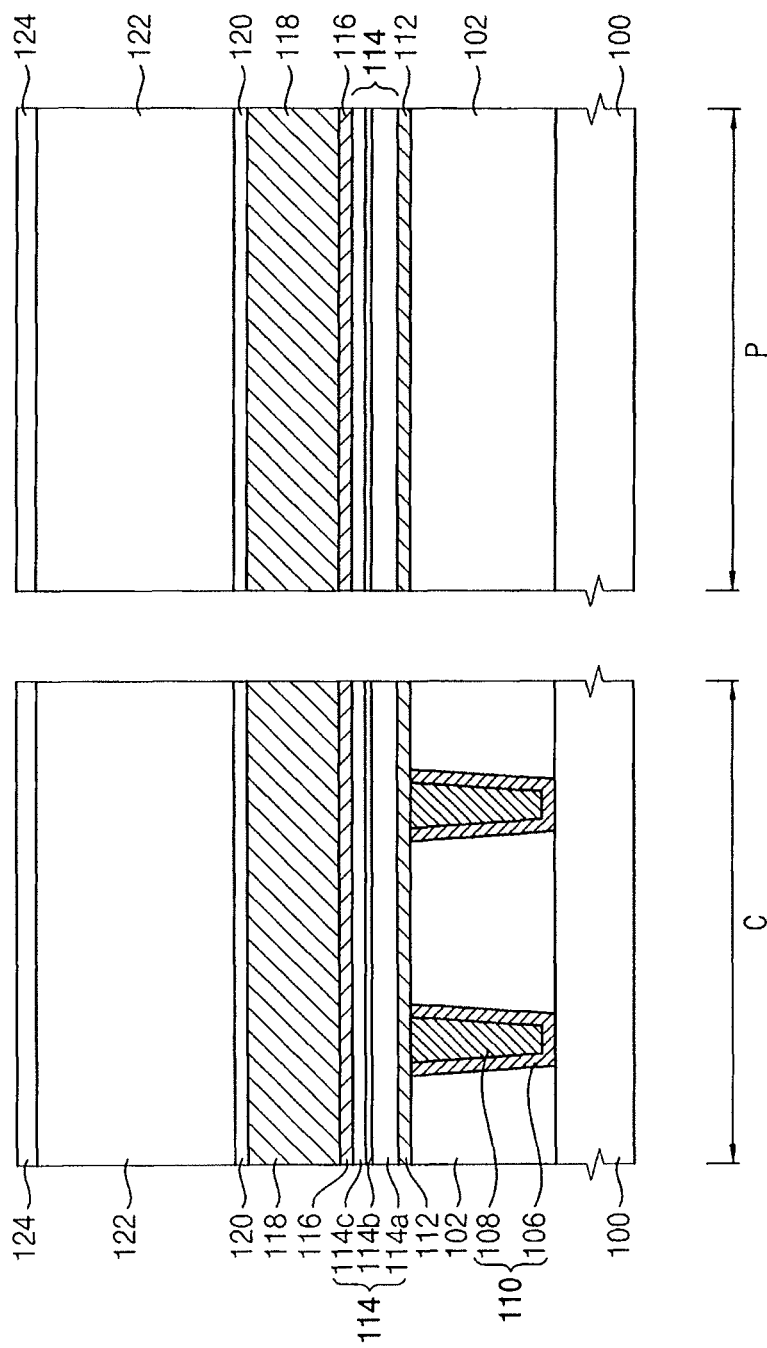

Referring to FIG. 3, a lower electrode layer 112, an MTJ layer 114, and a middle electrode layer 116 may be sequentially formed on the first insulating interlayer 102 and the lower electrode contact 110. An upper electrode layer 118, a first adhesion layer 120, a mold layer 122, and a second adhesion layer 124 may be sequentially formed on the middle electrode layer 116.

The lower electrode layer 112 may be formed of a metal, e.g., tantalum, titanium, etc., and/or a metal nitride, e.g., tantalum nitride, titanium nitride, etc.

The MTJ layer 114 may include a first magnetic layer 114a, a tunnel barrier layer 114b, and a second magnetic layer 114c sequentially stacked.

The middle electrode layer 116 may be formed of a metal, e.g., tantalum, titanium, etc., and/or a metal nitride, e.g., tantalum nitride, titanium nitride, etc. In some example embodiments, the middle electrode layer 116 may not be formed.

The upper electrode layer 118 may be formed of a metal, e.g., tungsten, Cu, Pt, Ni, Ag, Au, etc. For example, the upper electrode layer 118 may be formed of tungsten.

The first adhesion layer 120 may be formed so that the mold layer 122 may be bonded thereto. In example embodiments, the first adhesion layer 120 may include a nitride, e.g., silicon nitride, and silicon oxynitride, etc.

The mold layer 122 may serve as a mold for forming an etching mask pattern in a subsequent damascene process. In example embodiments, the mold layer 122 may include a material that may be removed by an ashing process. For example, the mold layer 122 may include carbon, e.g., a spin on hard mask (SOH).

The second adhesion layer 124 may be formed so that the photoresist film may be bonded thereto. The second adhesion layer 124 may serve as an etching mask pattern for etching the mold layer. In example embodiments, the second adhesion layer 124 may include a nitride, e.g., silicon nitride, silicon oxynitride, etc.

Figure 4:
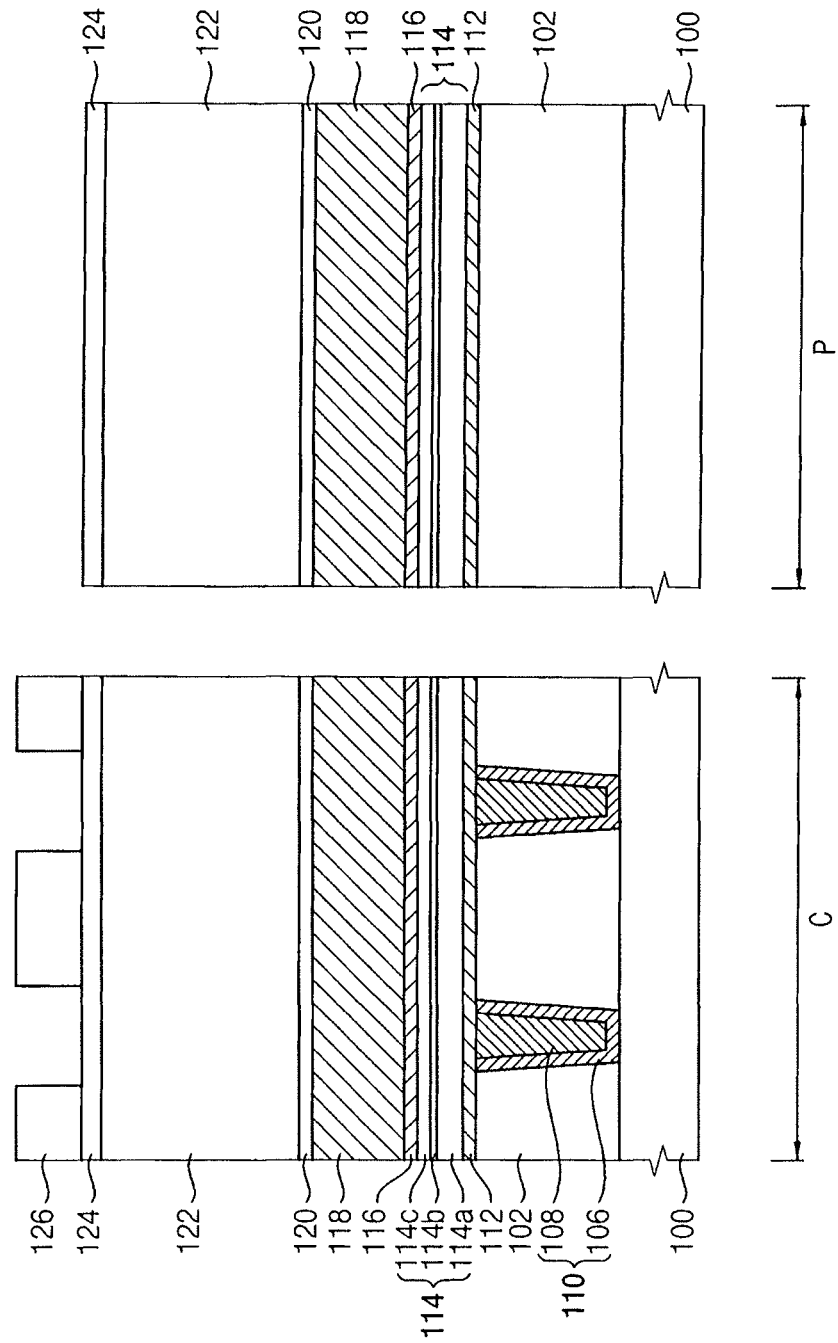

Referring to FIG. 4, a photoresist pattern 126 may be formed on the second adhesion layer 124 by performing a photo process.

The photoresist pattern 126 may be formed only on the second adhesion layer 124 of the cell region C. The photoresist pattern 126 may include an opening having an exposing portion faced, e.g., overlapped, with the lower electrode contact 110. On the other hand, the photoresist pattern 126 may not be formed on the second adhesion layer 124 of the peripheral region P, so that the second adhesion layer 124 may be exposed in the peripheral region P.

Figure 5:
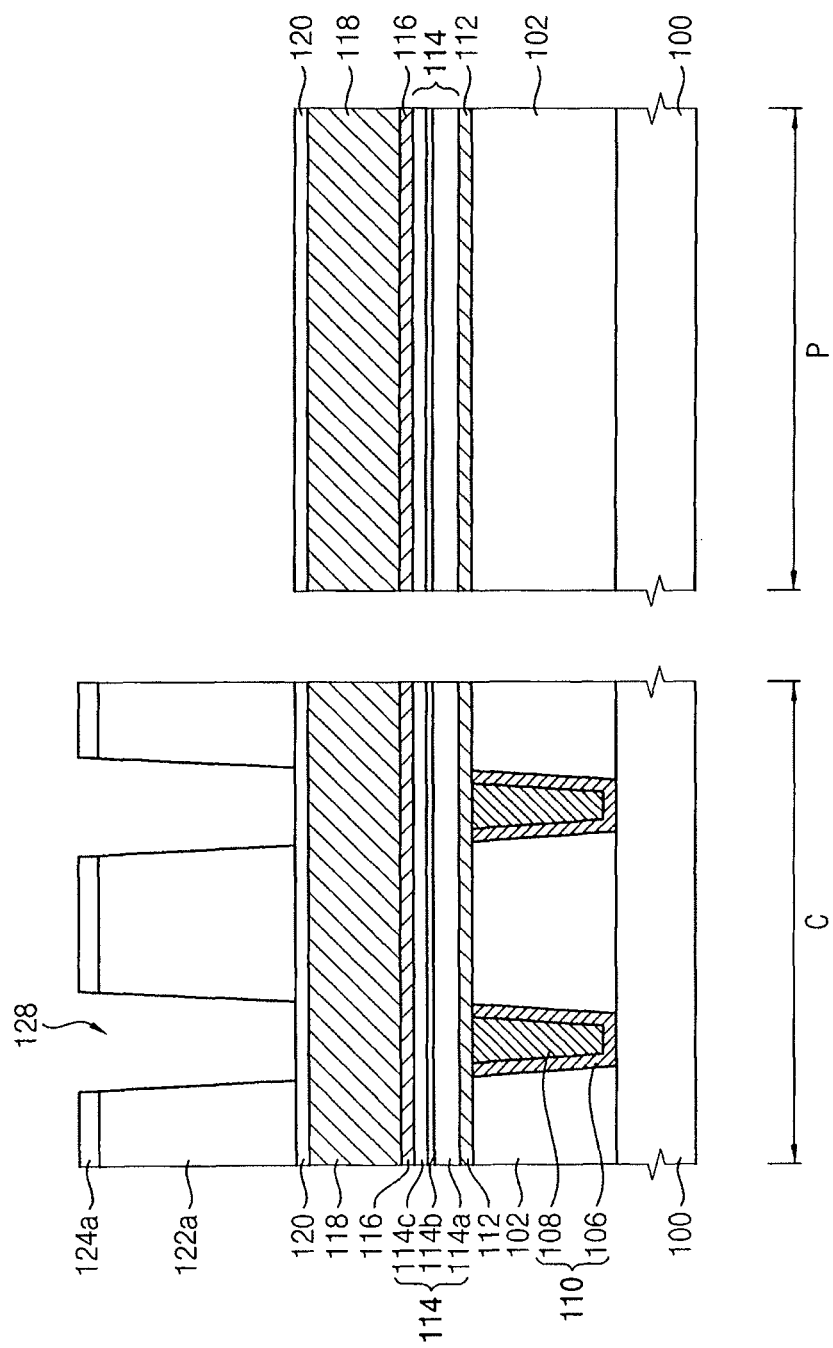

Referring to FIG. 5, the second adhesion layer 124 may be etched using the photoresist pattern 126 as an etch mask to form a second adhesion pattern 124a. The mold layer 122 may be etched using the second adhesion pattern 124a as an etching mask to form a mold pattern 122a. During the etching processes, the photoresist pattern 126 may be removed.

As the photoresist pattern 126 is not formed in the peripheral region P, the second adhesion layer 124 and the mold layer 122 in the peripheral region P may be removed by the etching processes. Thus, the first adhesion layer 120 may be exposed in the peripheral region P.

A stacked structure including the mold pattern 122a and the second adhesion pattern 124a may be formed in the cell region C. The stacked structure may include a second opening 128 faced, e.g., overlapped, with the upper surface of the lower electrode contact 110 in a vertical direction.

Figure 6:
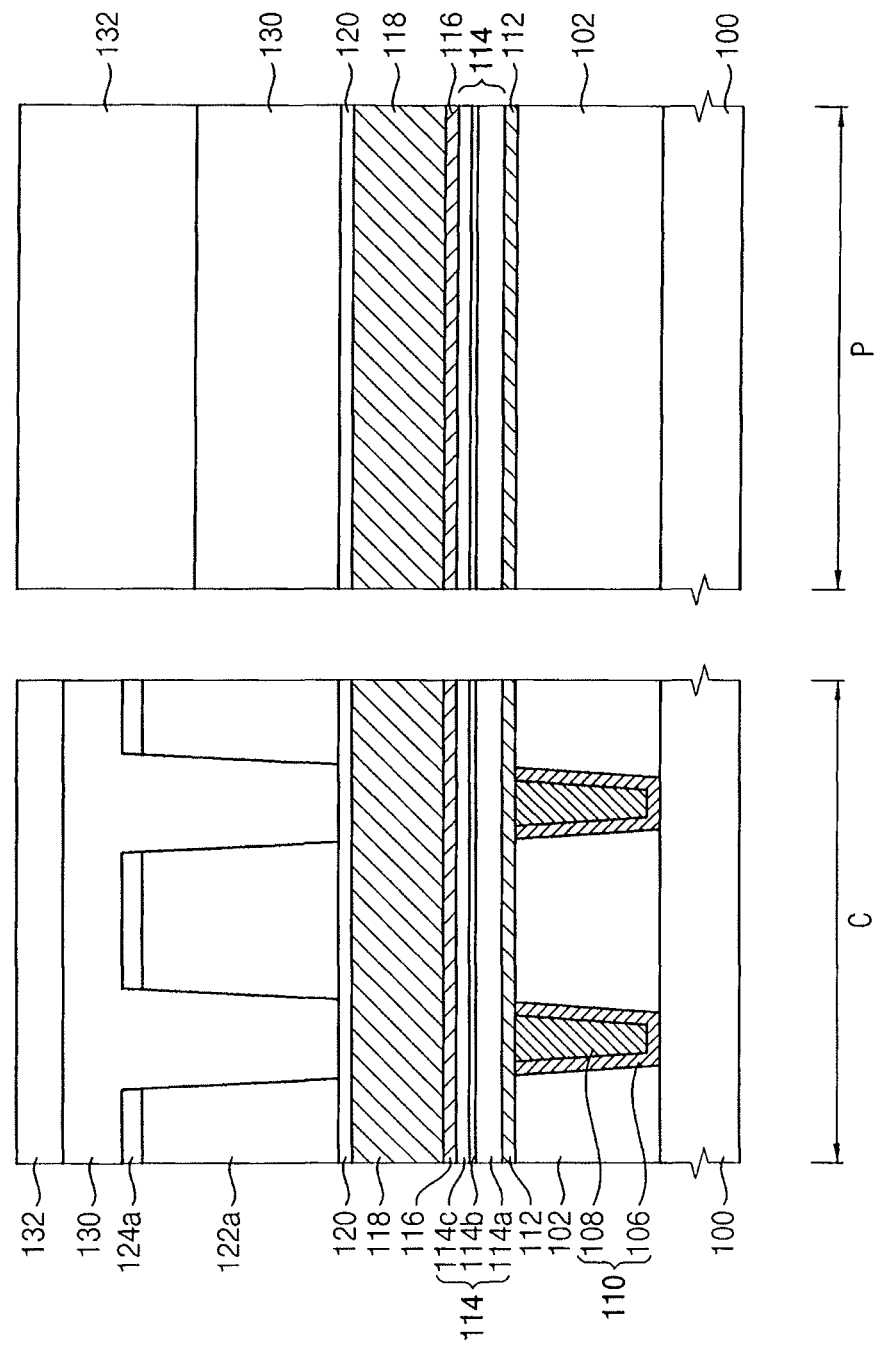

Referring to FIG. 6, a first hard mask layer 130 may be formed on the second adhesion pattern 124a of the cell region C to fill the second opening 128 and to cover the first adhesion layer 120 of the peripheral region P. A second hard mask layer 132 may be formed on the first hard mask layer 130. Thus, a hard mask structure including the first and second hard mask layers 130 and 132 may be formed in the cell region C and the peripheral region P.

The first hard mask layer 130 may serve as an etch mask for forming the upper electrode in a subsequent process. The first hard mask layer 130 may be formed to sufficiently fill the second opening 128 by a deposition process having an excellent step coverage characteristic. In example embodiments, the first hard mask layer 130 may be formed by an atomic layer deposition (ALD) process. In example embodiments, the first hard mask layer 130 may include silicon oxide.

As the mold pattern 122a is not formed in the peripheral region P, an upper surface of the first hard mask layer 130 in the peripheral region P may be lower than an upper surface of the first hard mask layer 130 in the cell region C, e.g., along a vertical direction relative to the substrate 100.

The second hard mask layer 132 may be formed to reduce or remove a step difference of the upper surfaces of the mask structure in the cell region C and the peripheral region P. Thus, a thickness of the second hard mask layer 132 in the cell region C may be less than a thickness of the second hard mask layer 132 in the peripheral region P, e.g., along a vertical direction. The second hard mask layer 132 may include an insulating material having fluidity, so that the second hard mask layer 132 may be formed to be relatively thick at a low step portion. In example embodiments, the second hard mask layer 132 may be formed by a chemical vapor deposition (CVD) process or a spin on glass (SOG) process. In example embodiments, the second hard mask layer 132 may include silicon oxide.

In example embodiments, an upper surface of the second hard mask layer 132 in the peripheral region P may be higher than an upper surface of the second adhesion pattern 124a in the cell region C. Thus, the step difference of the upper surfaces of the second hard mask layer 132 in the cell region C and the peripheral regions P may decrease. For example, the upper surfaces of the second hard mask layer 132 in the cell region C and the peripheral region P may be coplanar with each other. Alternatively, the upper surfaces of the second hard mask layer 132 in the cell region C and peripheral region P may have a slight step.

Figure 7:
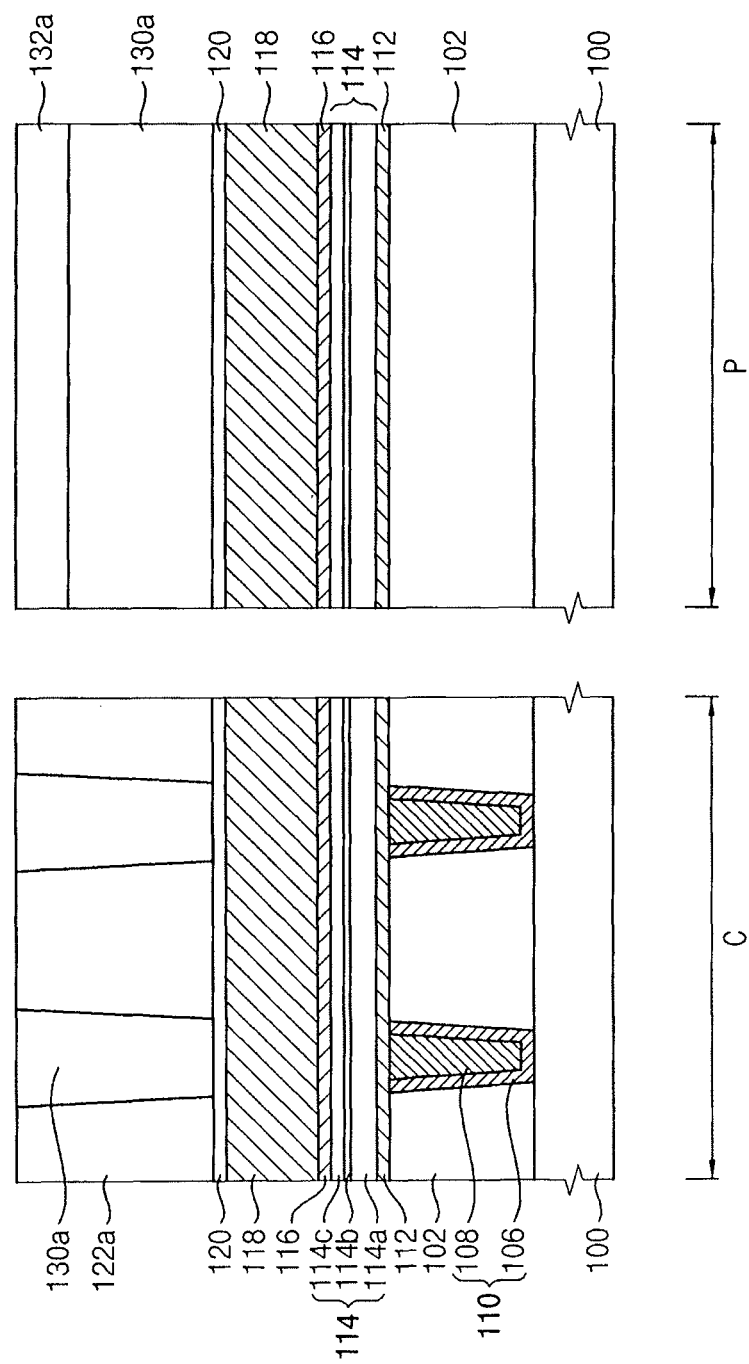

Referring to FIG. 7, the second hard mask layer 132 and the first hard mask layer 130 may be planarized until an upper surface of the mold pattern 122a in the cell region C is exposed. Thus, a first hard mask 130a may be formed to fill the second opening 128 in the cell region C, and a first hard mask 130a and a second hard mask 132a may be formed on the first adhesion layer 120 in the peripheral region P. In example embodiments, the planarization process may include a chemical mechanical polishing (CMP) process.

In example embodiments, the first hard mask 130a in the cell region C may have a pillar shape that may face, e.g., overlap, the lower electrode contact 110 in a vertical direction. The first and second hard masks 130a and 132a in the peripheral region P may cover an entire upper surface of the first adhesion layer 120 in the peripheral region P.

In some example embodiments, during the planarization process, all of the second hard masks 132a in the peripheral region P may be removed. In this case, the first hard mask 130a may be formed on the first adhesion layer 120 in the peripheral region P.

Figure 8:
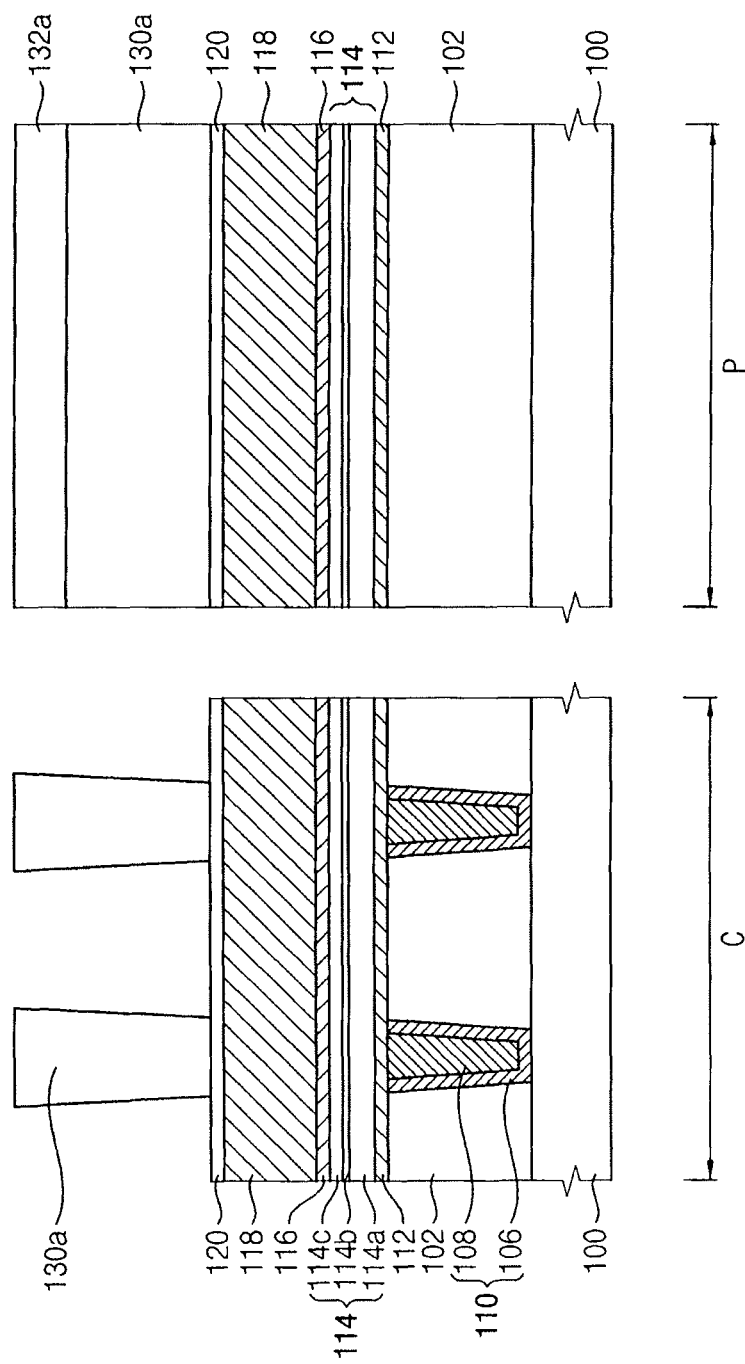

Referring to FIG. 8, the mold pattern 122a may be removed. Thus, the first hard mask 130a having a pillar shape may be formed on the first adhesion layer 120 in the cell region C. The first hard mask 130a may be formed by a damascene process. In example embodiments, when the mold pattern 122a includes SOH, the mold pattern 122a may be removed by an ashing process.

Figure 9:
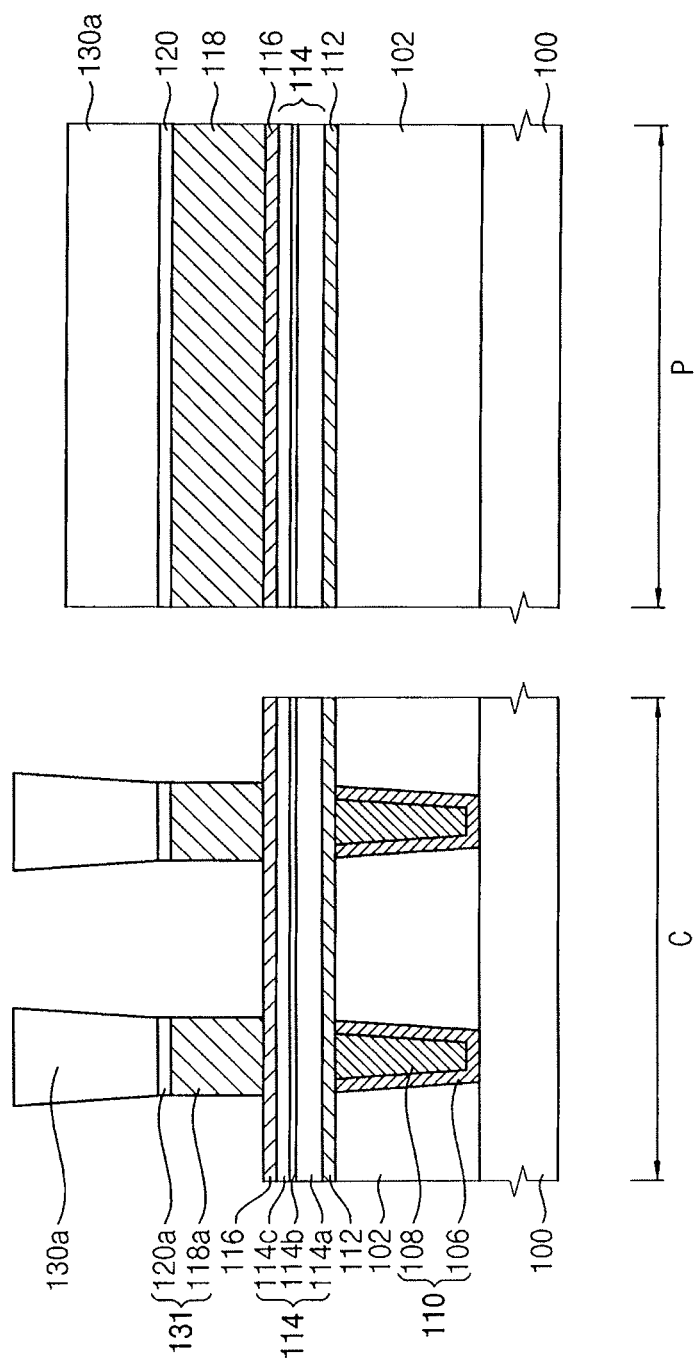

Referring to FIG. 9, the first adhesion layer 120 and the upper electrode layer 118 in the cell region may be anisotropically etched using the first and second hard masks 130a and 132a as an etching mask. The anisotropic etching process may include a RIE process.

In the etching process, the first adhesion layer 120 and the upper electrode layer 118 between the first hard masks 130a may be etched to form a cell mask structure 131 including an upper electrode 118a and a first adhesion pattern 120a stacked on the middle electrode layer 116. During the etching process, the first hard mask 130a in the cell region may be completely or partially removed. Further, the first and second hard masks 130a and 132a in the peripheral region P may be completely or partially removed by the etching process.

In example embodiments, the second hard mask 132a in the peripheral region P may be completely removed, and the first hard mask 130a in the cell region C and the peripheral region P may be partially removed by the etch process. Thus, the first hard mask 130a may remain to have some thickness in the cell region C and the peripheral region P. In some example embodiments, the first hard mask 130a in the cell region C and the first and second hard masks 130a and 132a in the peripheral region P may be completely removed by the etching process.

Figure 10:
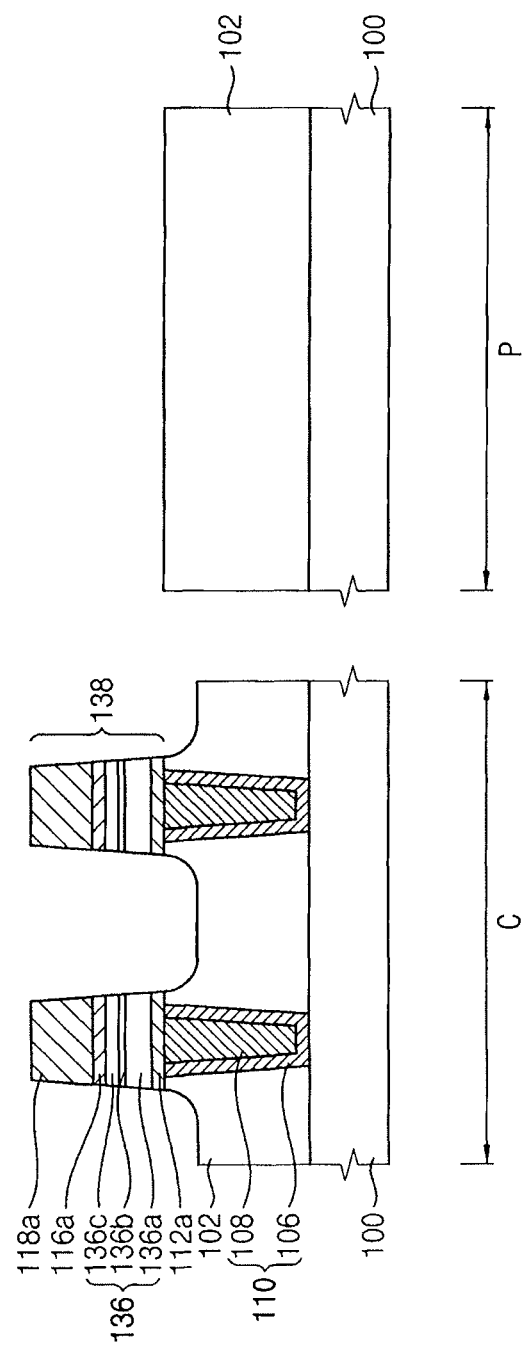

Referring to FIG. 10, the middle electrode layer 116, the MTJ layer 114, and the lower electrode layer 112 in the cell region C may be sequentially etched using the cell mask structure 131 as an etch mask. Subsequently, an upper portion of the first insulating interlayer 102 may be etched. Also, in the etching process, the first hard mask 130a, the first adhesion layer 120, the upper electrode layer 118, the middle electrode layer 116, the MTJ layer 114, and the lower electrode layer 112 in the peripheral region P may be etched together.

The first structure 138 including the lower electrode 112a, the MTJ structure 136, the middle electrode 116a, and the upper electrode 118a stacked may be formed in the cell region C by the etching process. An upper portion of the upper electrode 118a may be partially removed by the etching process. Also, an upper surface of the first insulating interlayer 102 in the peripheral region P may be exposed.

The etch process may include a physical etching process such as an ion beam etching (IBE) process. For example, the etching process may include an argon ion sputtering etching. In example embodiments, in the etching process, an incidence angle of an ion beam serving as an etching source may be changeable.

Particularly, the middle electrode layer 116, the MTJ layer 114, and the lower electrode layer 112 between the cell mask structures 131 in the cell region C may be patterned by a first etching process. In the first etching process, the ion beam may be incident at a high angle of 70 degrees or more with respect to an upper surface of the substrate 100. During the first etching process, sputtered metallic materials may be redeposited on a sidewall of a patterned structure. Therefore, after the first etching process, a second etching process may be further performed to remove the redeposited metallic materials. In the second etching process, the ion beam may be incident at a low angle of 70 degrees or less with respect to the upper surface of the substrate 100. During the first and second etching processes, layers formed in the peripheral region P may be etched together.

Thus, in the first and second etching processes, the ion beam may be incident on upper surfaces of the exposed layers to have an angle with respect to the upper surface of the substrate 100. As the cell mask structure 131 is only formed in the cell region C, the cell mask structure 131 may disturb a movement of the ion beams being served as the etching source. That is, in the etching process, a shadowing effect may be generated. Thus, the ion beams being applied to the exposed layers between the cell mask structures 131 may be reduced. Therefore, an etching rate of the exposed layers between the cell mask structures 131 in the cell region C may decrease.

On the other hand, a first hard mask 130a having a flat upper surface may be exposed in the peripheral region P. Thus, the ion beams may be supplied to an entire surface of the first hard mask 130a and subsequently to the entire surface of the layers formed below the first hard mask 130a, without the shadowing effect. Therefore, an etching rate of the layers formed in the peripheral region P may be higher than an etching rate of the layers formed in the cell region C. That is, during etching the middle electrode layer 116, the MTJ layer 114, the lower electrode layer 112, and an upper portion of the first insulating interlayer 102 formed between the cell mask structures 131 in the cell region C, the first hard mask 130a, the first adhesion layer 120, the upper electrode layer 118, the middle electrode layer 116, the MTJ layer 114, and the lower electrode layer 112 formed in the peripheral region P may be etched together. After the etching process, an upper surface of the first insulating interlayer 102 exposed in the peripheral region P may be substantially flat.

The first structure 138 may have a pillar shape contacting the lower electrode contact 110. The MTJ structure 136 may include the first magnetic pattern 136a, the tunnel barrier pattern 136b, and the second magnetic pattern 136c sequentially stacked. As the upper portion of the first insulating interlayer 102 in the cell region C is etched, an upper surface of the first insulating interlayer 102 exposed between the first structures 138 may be lower than an upper surface of the lower electrode contact 110.

As etched layers in the peripheral region P have a larger stacked number and a greater thickness than etched layers in the cell region C, the upper portion of the first insulating interlayer 102 may hardly be etched in the etching process. In example embodiments, in the etching process, an etching thickness, e.g., removed thickness, of the first insulating interlayer 102 in the peripheral region P is less than an etching thickness of the first insulating interlayer 102 in the cell region C. The upper surface of the first insulating interlayer 102 in the peripheral region P may be higher, e.g., relative to a bottom of the substrate 100, than the upper surface of the first insulating interlayer 102 formed between, e.g., and exposed between, the first structures 138 in the cell region C. The upper surface of the first insulating interlayer 102 in the peripheral region P may be coplanar with or lower than the upper surface of the lower electrode contact 110.

Figure 11:
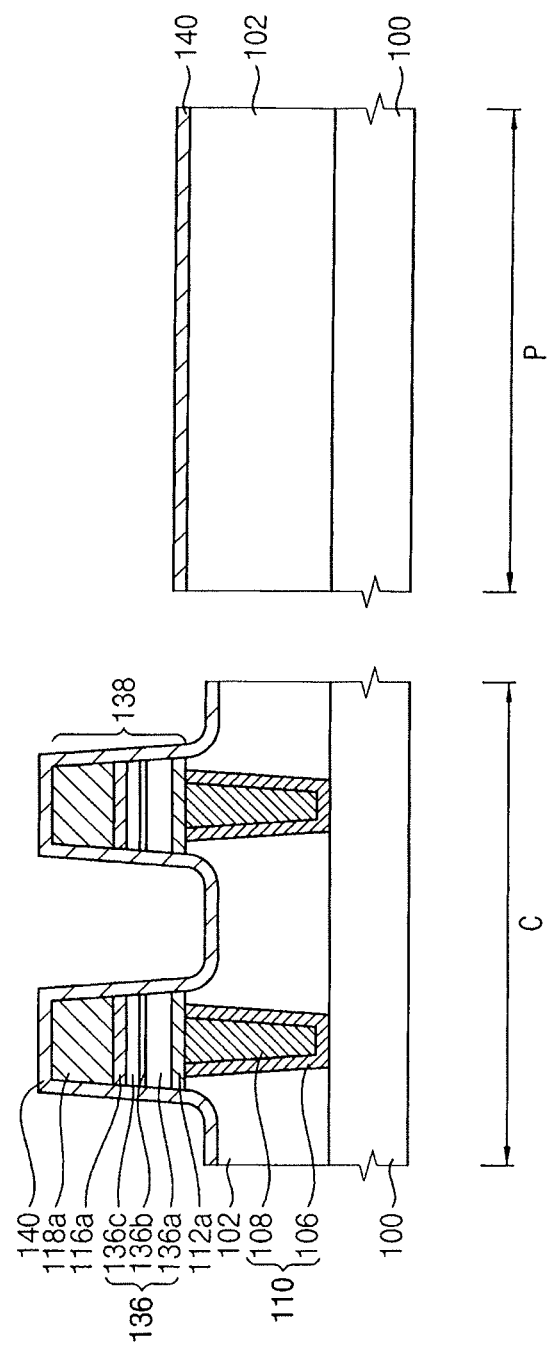

Referring to FIG. 11, the first capping layer 140 may be formed to cover surfaces of the first structure 138 and the first insulating interlayer 102. The first capping layer 140 may be conformally formed on the surfaces of the first structure 138 and the first insulating interlayer 102. Thus, the first capping layer 140 may have a substantially uniform thickness.

The first capping layer 140 in the cell region C may directly contact a sidewall of the first structure 138, so that the first capping layer 140 may protect a sidewall of the MTJ structure 136 included in the first structure 138. The first capping layer 140 in the peripheral region P may have a flat upper surface and a flat lower surface.

The first capping layer 140 may include, e.g., silicon nitride. The first capping layer 140 may be formed by an ALD process or a CVD process.

The upper surface of the first capping layer 140 on the first insulating interlayer 102 in the peripheral region P may be higher than the upper surface of the first capping layer 140 on the first insulating interlayer 102 in the cell region C. That is, the upper surface of the first capping layer 140 in the peripheral region P may be higher than a lowest portion of the first capping layer 140 in the cell region C.

Figure 12:
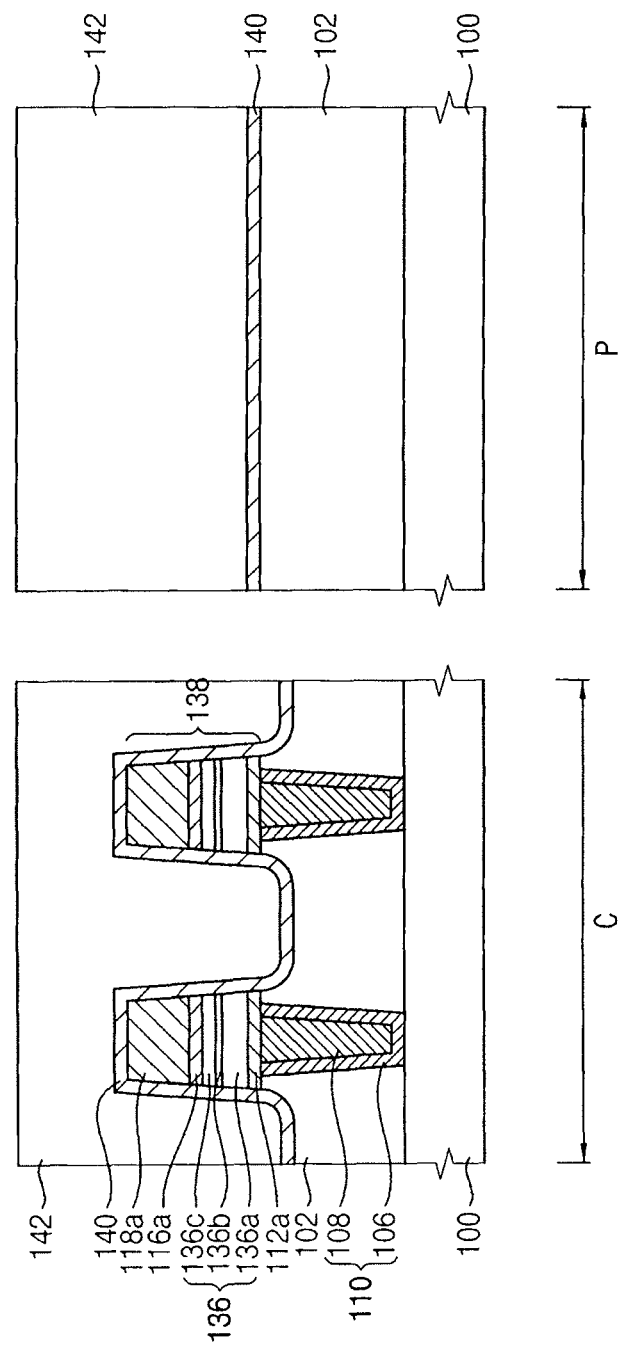

Referring to FIG. 12, the second insulating interlayer 142 may be formed on the first capping layer 140. The second insulating interlayer 142 may be formed to fill a gap between the first structures 138. The second insulating interlayer 142 may include silicon oxide.

A step difference between the cell region C, where the first structure 138 is formed, and the peripheral region P, where the first structure 138 is not formed, decreases. Thus, a step difference between upper surfaces of the second insulating interlayer 142 in the cell region C and the peripheral region P may be reduced.

Figure 13:
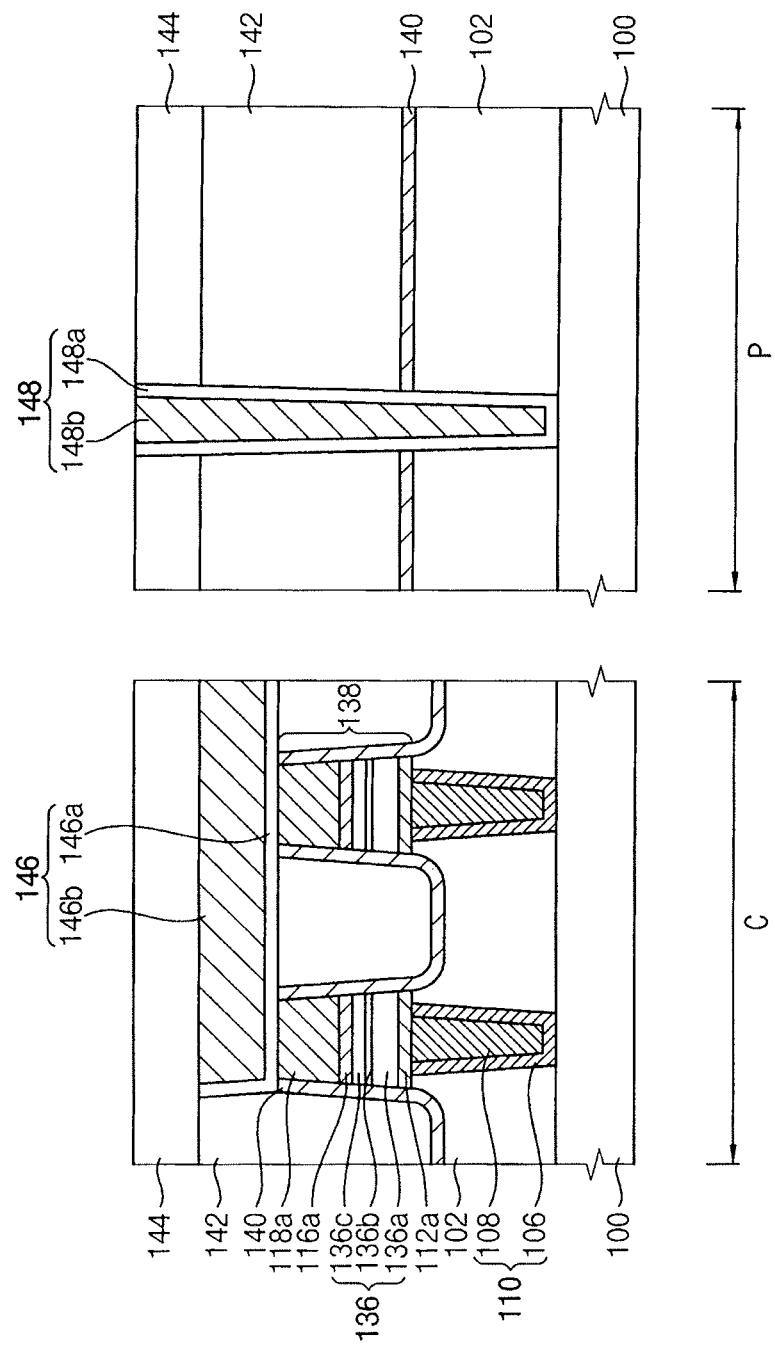

Referring to FIG. 13, the second insulating interlayer 142 and the first capping layer 140 in the cell region C may be etched to form a trench exposing an upper surface of the upper electrode 118a. The bit line 146 may be formed in the trench. The bit line 146 may include the second barrier pattern 146a and the second metal pattern 146b.

The third insulating interlayer 144 may be formed on the second insulating interlayer 142. Then, the third insulating interlayer 144, the second insulating interlayer 142, the first capping layer 140, and the first insulating interlayer 102 in the peripheral region P may be etched to form a via hole exposing the substrate 100 or a lower wiring on the substrate 100. The via contact 148 may be formed in the via hole.

For forming the via contact 148, a barrier layer may be formed on surfaces of the via hole and the second insulating interlayer 142, and a metal layer may be formed on the barrier layer to fill an inner space of the via hole. Then, the barrier layer and the metal layer may be planarized until an upper surface of the second insulating interlayer 142 may be exposed to form the via contact 148 filling the via hole. Thus, the via contact 148 may include the third barrier pattern 148a and the third metal pattern 148b.

A step difference between the second insulating interlayers 142 in the cell region C and the peripheral region P and a step difference between the third insulating interlayers 144 in the cell region C and the peripheral region P may decrease. Thus, variation and failures of a photolithography process for forming the via hole may decrease. Therefore, failures of the via contact 148 may be reduced. Upper wirings may be further formed on the via contact 148.

As described above, the MRAM device having low step difference between the cell region and the peripheral region may be manufactured.

FIGS. 14 to 24 are cross-sectional views illustrating stages of a method of manufacturing a MRAM device in accordance with example embodiments.

First, processes substantially the same as or similar to those illustrated with reference to FIG. 2 may be performed to form the first insulating interlayer 102 and lower electrode contact 110 through the first insulating interlayer 102 on the substrate 100 including the cell region C and the peripheral region P.

Figure 14:
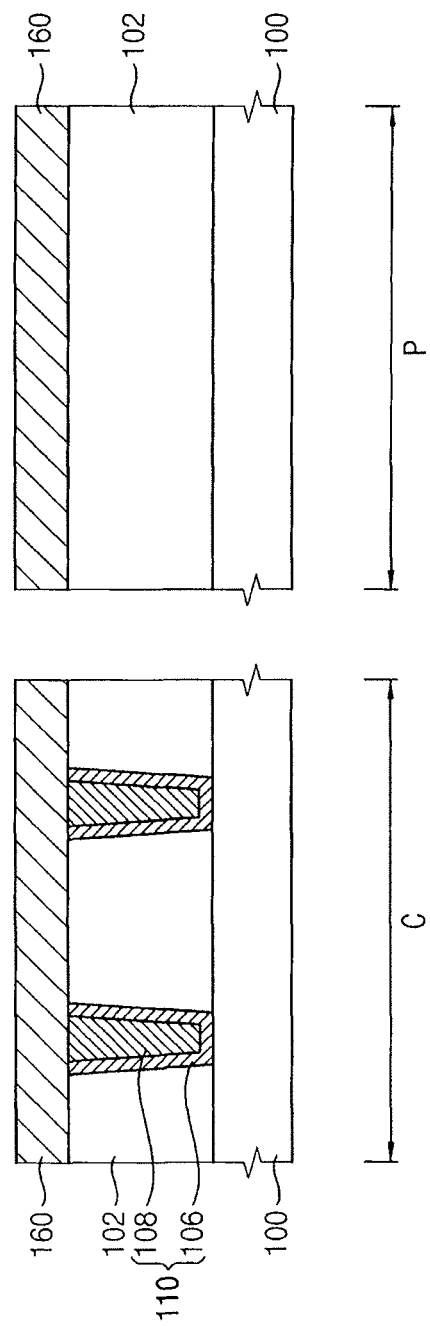
FIGS. 14 to 24 illustrate cross-sectional views of stages in a method of manufacturing a MRAM device in accordance with example embodiments.

Referring to FIG. 14, a preliminary electrode layer 160 may be formed on the first insulating interlayer 102 and the lower electrode contact 110. The preliminary electrode layer 160 may be formed to reduce a step difference between the cell region C and the peripheral region P, in a subsequent process.

Particularly, the preliminary electrode layer 160 may compensate for a layer formed in the peripheral region P that may be etched faster than a layer formed in the cell region C, in a subsequent ion beam etching process. According to a difference between etch rates of the layers formed in the peripheral region P and the cell region C, a thickness of the preliminary electrode layer 160 may be controlled. Further, a height of an upper surface of the first insulating interlayer 102 in the peripheral region P may be controlled in a subsequent process by adjusting the thickness of the preliminary electrode layer 160. The preliminary electrode layer 160 may include a metal such as titanium, tantalum, etc., or a metal nitride such as titanium nitride, tantalum nitride, etc.

Figure 15:
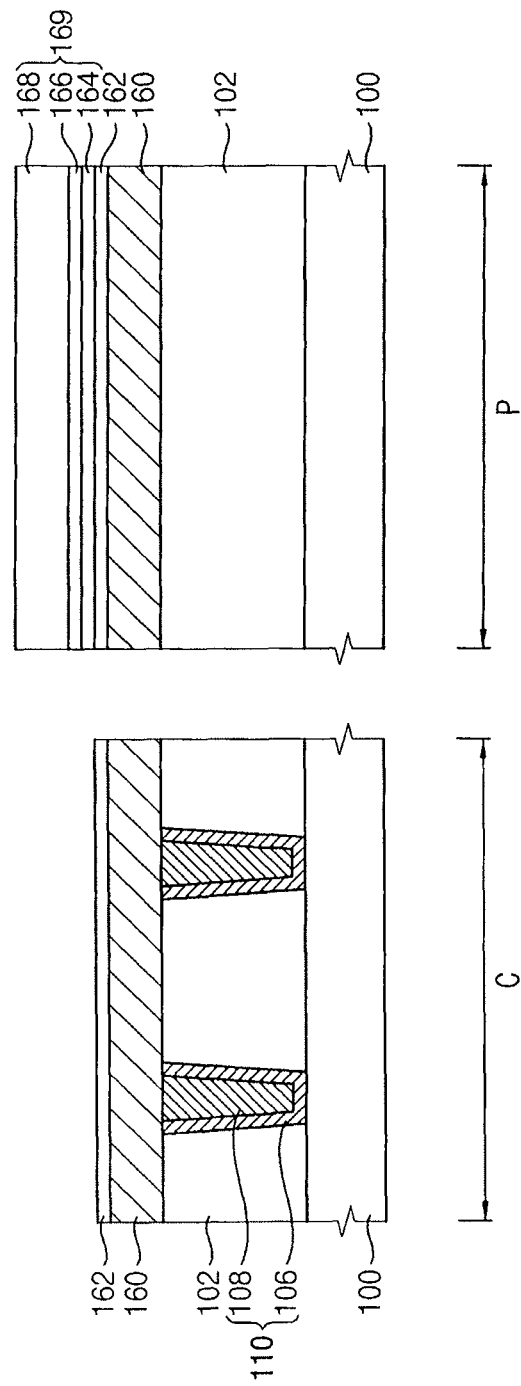

Referring to FIG. 15, a lower capping layer 162 may be formed on the preliminary electrode layer 160. A first mask structure 169 may be formed to cover the lower capping layer 162 in the peripheral region P. The first mask structure 169 may not be formed on the lower capping layer 162 in the cell region C, so that the lower capping layer 162 may be exposed in the cell region C. In example embodiments, the first mask structure 169 may include a lower adhesion pattern 164, a lower mask 166, and a first photoresist pattern 168 stacked.

In example embodiments, the lower capping layer 162 may include a nitride such as silicon nitride, silicon oxynitride, etc.

For forming the first mask structure 169, a lower adhesion layer and a lower mask layer may be formed on the lower capping layer 162. The first photoresist pattern 168 may be formed on the lower mask layer to cover an entire peripheral region P. Also, the lower mask layer may include carbon, e.g., a spin on hard mask (SOH). Then, the lower mask layer and the lower adhesion layer in the cell region C may be sequentially etched using the first photoresist pattern 168 as an etching mask to form the first mask structure 169.

Figure 16:
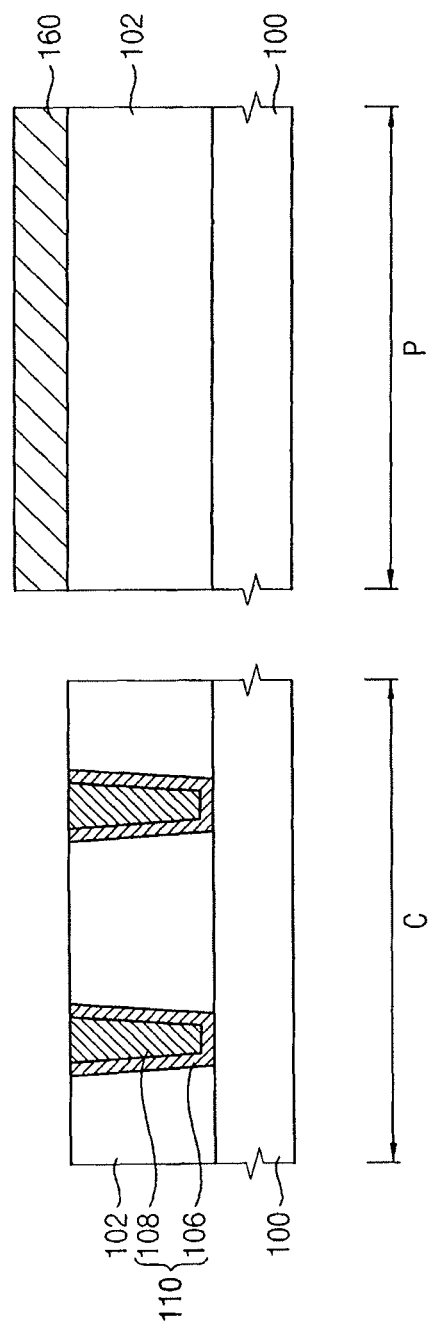

Referring to FIG. 16, the lower capping layer 162 and the preliminary electrode layer 160 in the cell region C may be removed using the first mask structure 169 as an etch mask. During the etching process, the first mask structure 169 and the lower capping layer 162 in the peripheral region P may be mostly removed.

Thus, the upper surfaces of the first insulating interlayer 102 and the lower electrode contact 110 may be exposed in the cell region C. Also, the preliminary electrode layer 160 may be exposed in the peripheral region P. As the preliminary electrode layer 160 remains only on the peripheral region P, the upper surface of the preliminary electrode layer 160 exposed in the peripheral region P may be higher than the upper surface of the first insulating interlayer 102 exposed in the cell region C.

Figure 17:
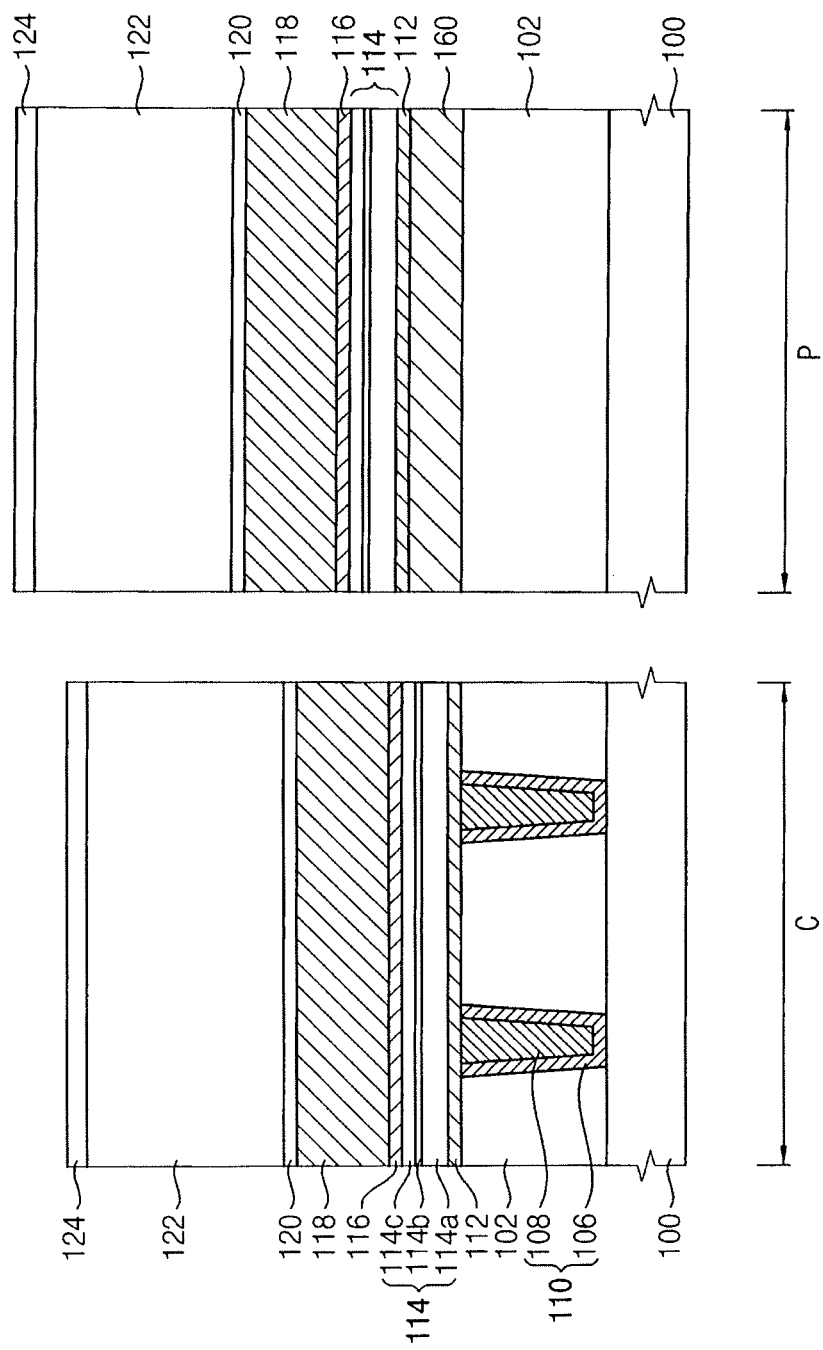

Referring to FIG. 17, the lower electrode layer 112, the MTJ layer 114, and the middle electrode layer 116 may be sequentially formed on the first insulating interlayer 102, the lower electrode contact 110, and the preliminary electrode layer 160. The upper electrode layer 118, the first adhesion layer 120, the mold layer 122, and the second adhesion layer 124 may be sequentially formed on the middle electrode layer 116. The process may be substantially the same as or similar to those illustrated with reference to FIG. 3. After performing the process, an upper surface of the second adhesion layer 124 in the peripheral region P may be higher than the upper surface of the second adhesion layer 124 in the cell region C.

Figure 18:
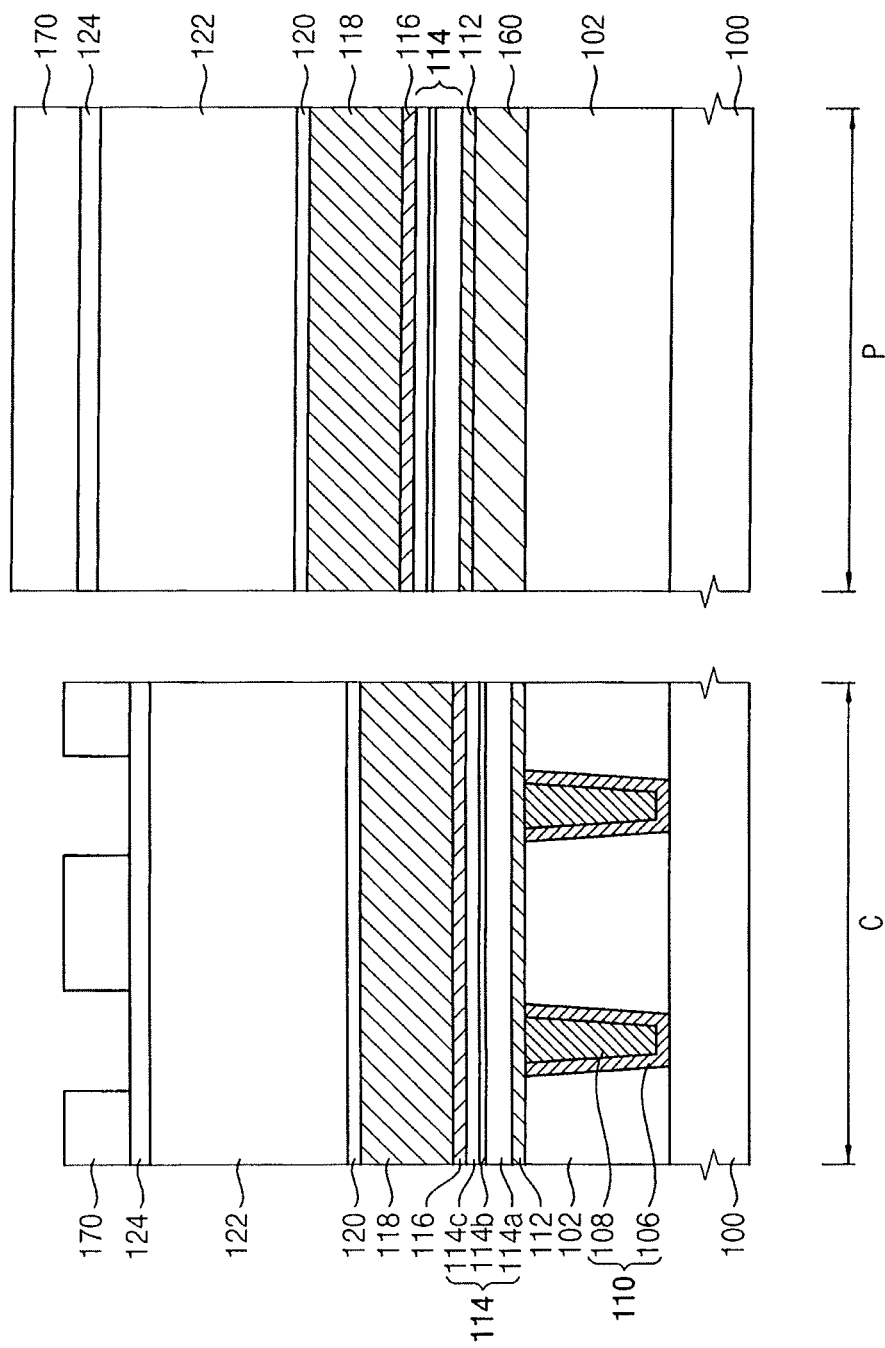

Referring to FIG. 18, a second photoresist pattern 170 may be formed on the second adhesion layer 124 by a photo process.

The second photoresist pattern 170 in the cell region C may include an opening having an exposing portion facing, e.g., overlapping, the lower electrode contact 110. The second photoresist pattern 170 in the peripheral region P may be formed to completely cover the upper surface of the second adhesion layer 124.

Figure 19:
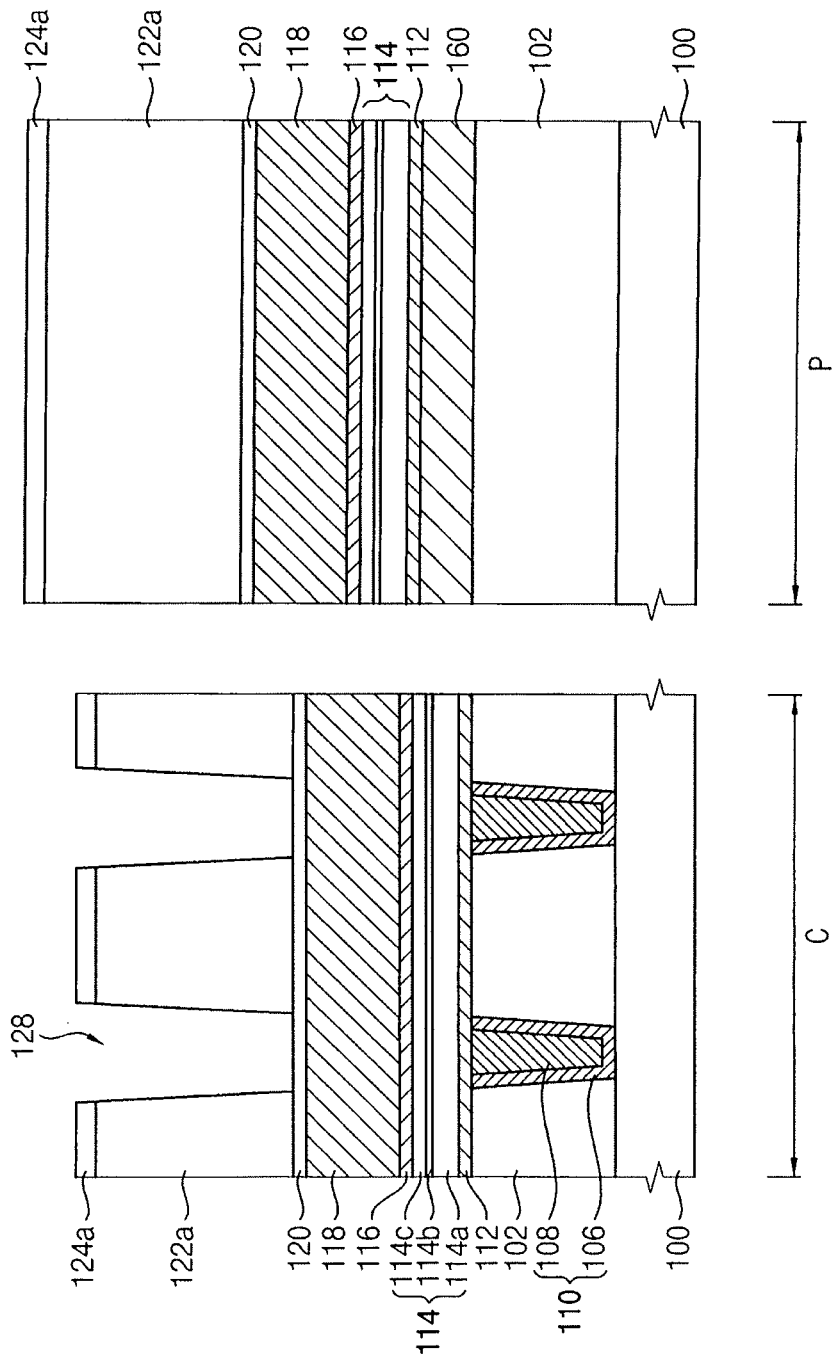

Referring to FIG. 19, the second adhesion layer 124 may be etched using the second photoresist pattern 170 as an etching mask to form a second adhesion pattern 124a. The mold layer 122 may be etched using the second adhesion pattern 124a as an etching mask to form a mold pattern 122a.

A stacked structure including the mold pattern 122a and the second adhesion pattern 124a may be formed on the cell region C and the peripheral region P by the etching process.

A second opening 128 may include the stacked structure in the cell region C, and the second opening 128 may face, e.g., overlap, an upper surface of the lower electrode contact 110 in the vertical direction. Also, the second adhesion layer 124 in the peripheral region P may be masked by the second photoresist pattern 170, so that the second adhesion layer 124 and the mold layer 122 may not be etched by the etching process. Thus, the stacked structure in the peripheral region P may cover an entire upper surface of the first adhesion layer 120. During the etching process, most of the second photoresist pattern 170 may be removed.

Figure 20:
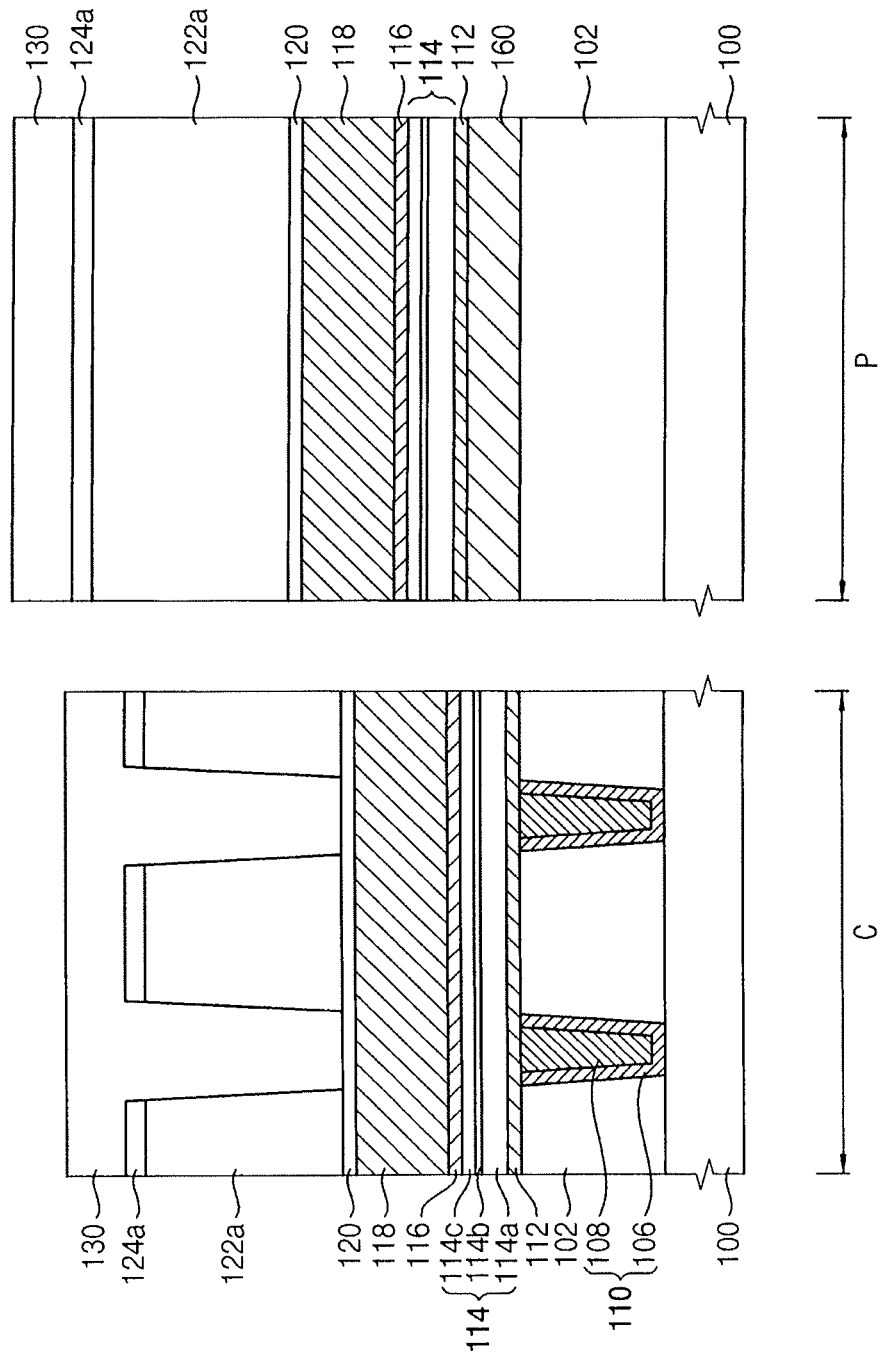

Referring to FIG. 20, a first hard mask layer 130 may be formed on the second adhesion pattern 124a to completely fill the second opening 128. In example embodiments, the first hard mask layer 130 may be formed by an ALD process. In example embodiments, the first hard mask layer 130 may include silicon oxide.

In this case, an upper surface of the first hard mask layer 130 in the peripheral region P may be higher than an upper surface of the first hard mask layer 130 in the cell region C.

Figure 21:
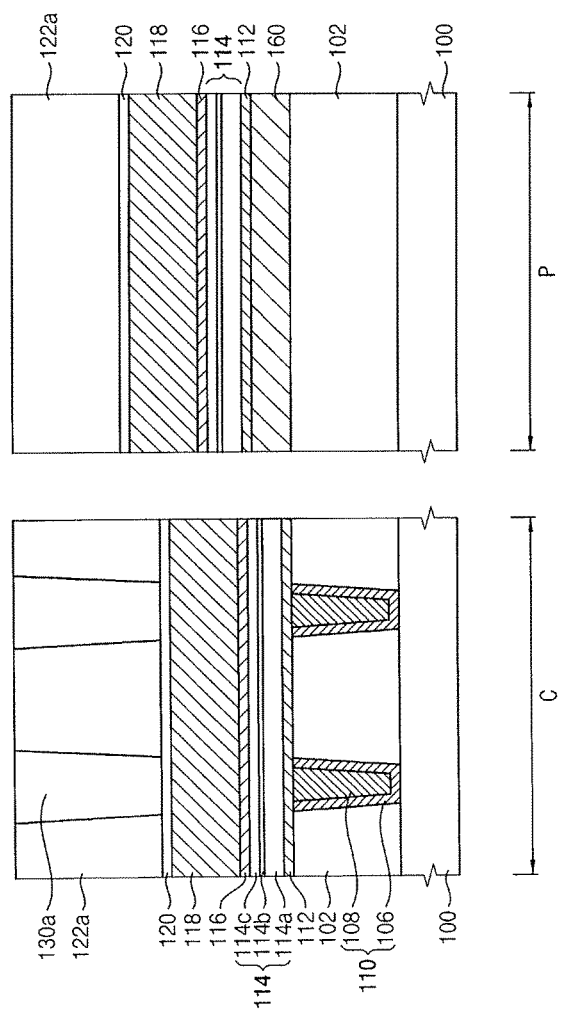

Referring to FIG. 21, the first hard mask layer 130 is planarized until an upper surface of the mold pattern 122a is exposed. Thus, a first hard mask 130a may be formed to fill the second opening 128 in the cell region C. Also, the upper surface of the mold pattern 122a may be exposed in the cell region C and the peripheral region P. The upper surfaces of the mold pattern 122a in the cell region C and the peripheral region P may be coplanar with each other. Thus, a thickness of the mold pattern 122a in the peripheral region P may be less than the thickness of the mold pattern 122a in the cell region C.

Figure 22:
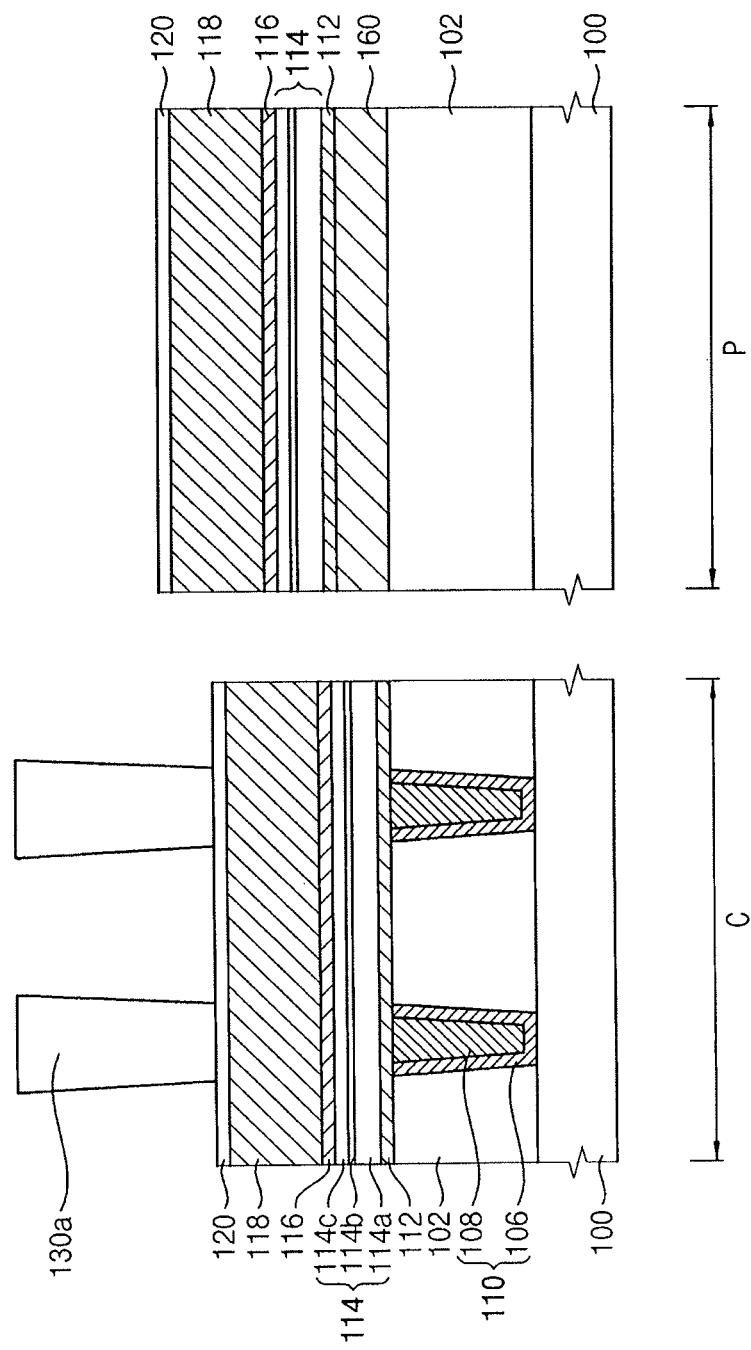

Referring to FIG. 22, the mold pattern 122a may be removed. Thus, a first hard mask 130a having a pillar shape may be formed on the first adhesion layer 120 in the cell region C. As the mold patterns 122a in the peripheral region P is completely removed, the first adhesion layer 120 may be exposed in the peripheral region P.

Figure 23:
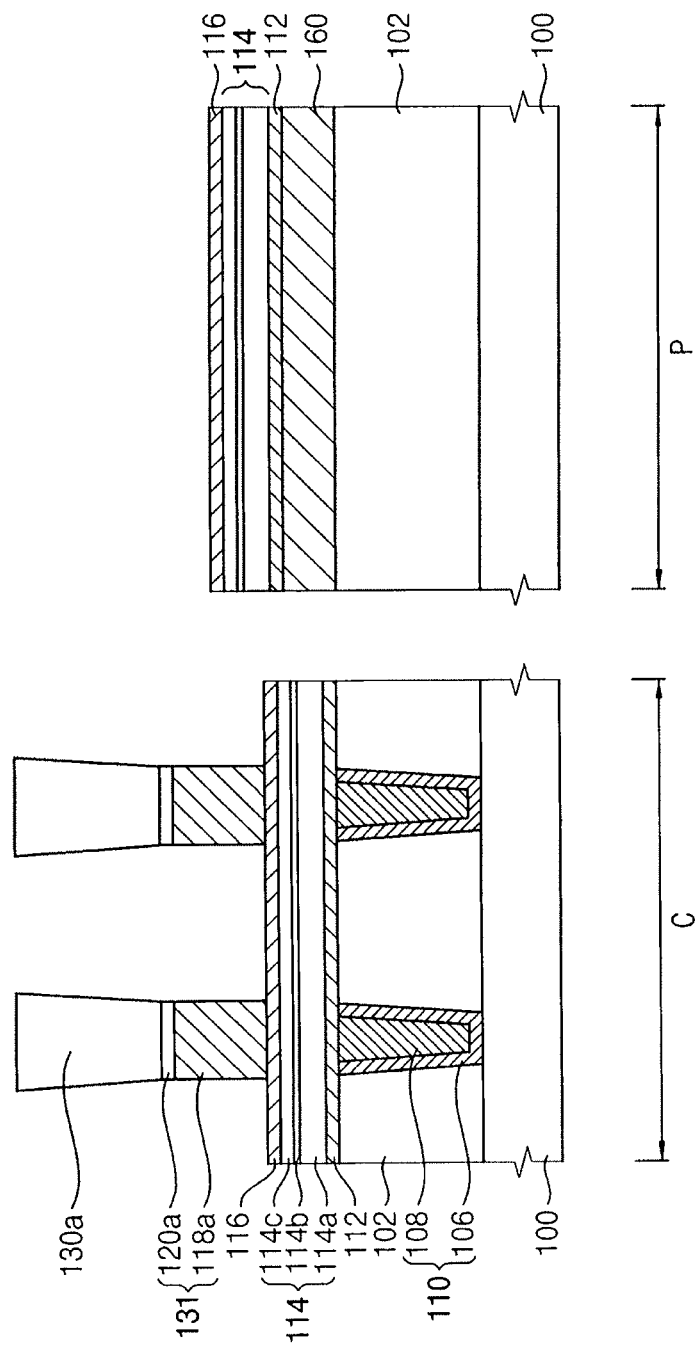

Referring to FIG. 23, the first adhesion layer 120 and the upper electrode layer 118 may be anisotropically etched using the first hard mask 130a as an etch mask. The anisotropic etching process may include an RIE process. The first adhesion layer 120 and the upper electrode layer 118 between the first hard masks 130a in the cell region C may be etched to form a cell mask structure 131 including an upper electrode 118a and a first adhesion pattern 120a stacked on the middle electrode layer 116. As first hard mask 130a is not formed in the peripheral region P, the first adhesion layer 120 and the upper electrode layer 118 may be completely removed in the peripheral region P.

Figure 24:
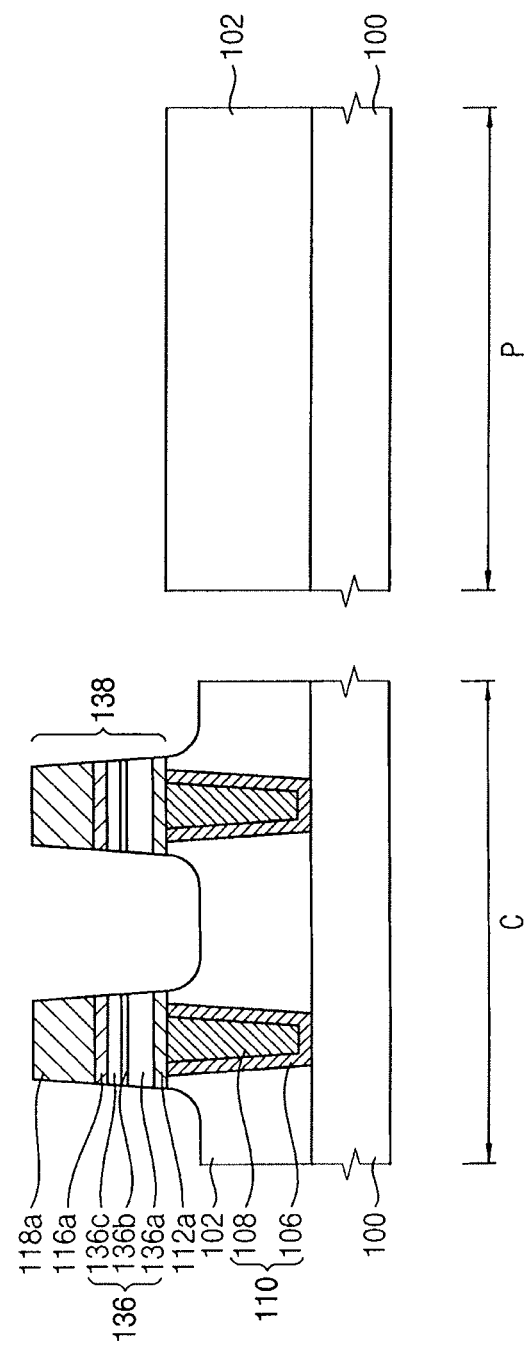

Referring to FIG. 24, the middle electrode layer 116, the MTJ layer 114 and the lower electrode layer 112 in the cell region C may be sequentially etched using the cell mask structure 131 as an etching mask. Subsequently, an upper portion of the first insulating interlayer 102 may be etched. In the etching process, the first adhesion layer 120, the upper electrode layer 118, the middle electrode layer 116, the MTJ layer 114, and the lower electrode layer 112 and preliminary electrode layer 160 in the peripheral region P may be etched.

The first structure 138 including the lower electrode 112a, the MTJ structure 136, the middle electrode 116a, and the upper electrode 118a stacked may be formed in the cell region C by the etching process. Also, the upper surface of the first insulating interlayer 102 may be exposed in the peripheral region P.

The etching process may include an IBE process. The etching process may be substantially the same as illustrated with reference to FIG. 10. When the ion beam etching process is performed, due to the shadowing effect, an etching rate of exposed layers between the cell mask structures 131 in the cell region C may be lower than an etching rate of exposed layers in the peripheral region P.

That is, during etching the middle electrode layer 116, the MTJ layer 114, the lower electrode layer 112, and the first insulating interlayer 102 between the cell mask structures 131 in the cell region C, the first adhesion layer 120, the upper electrode layer 118, the middle electrode layer 116, the MTJ layer 114, the lower electrode layer 112, and the preliminary electrode layer 160 in the peripheral region P may be etched. Also, after the etching process, the upper surface of the first insulating interlayer 102 in the peripheral region P may be flat.

The first structure 138 may have a pillar shape, and the first structure 138 may contact the lower electrode contact 110. The upper surface of the first insulating interlayer 102 between the first structures 138 may be lower than the upper surface of the lower electrode contact 110.

As the preliminary electrode layer 160 in the peripheral region P is more etched, an upper portion of the first insulating interlayer 102 in the peripheral region P may be hardly etched in the etching process. That is, a deposition thickness of the preliminary electrode layer 160 may be controlled in the previous process so that the upper portion of the first insulating interlayer 102 in the peripheral region P may not be substantially etched.

In the etching process, an etching thickness of the first insulating interlayer 102 in the peripheral region P may be less than an etching thickness of the first insulating interlayer 102 in the cell region C. Thus, the upper surface of the first insulating interlayer 102 in the peripheral region P may be higher than the upper surface of the first insulating interlayer 102 between the first structures 138 in the cell region C.

When the above process is performed, a structure shown in FIG. 10 may be formed. Thereafter, processes substantially the same as or similar to those illustrated with reference to FIGS. 11 to 13 may be performed to form a MRAM device shown in FIG. 1.

Figure 25:
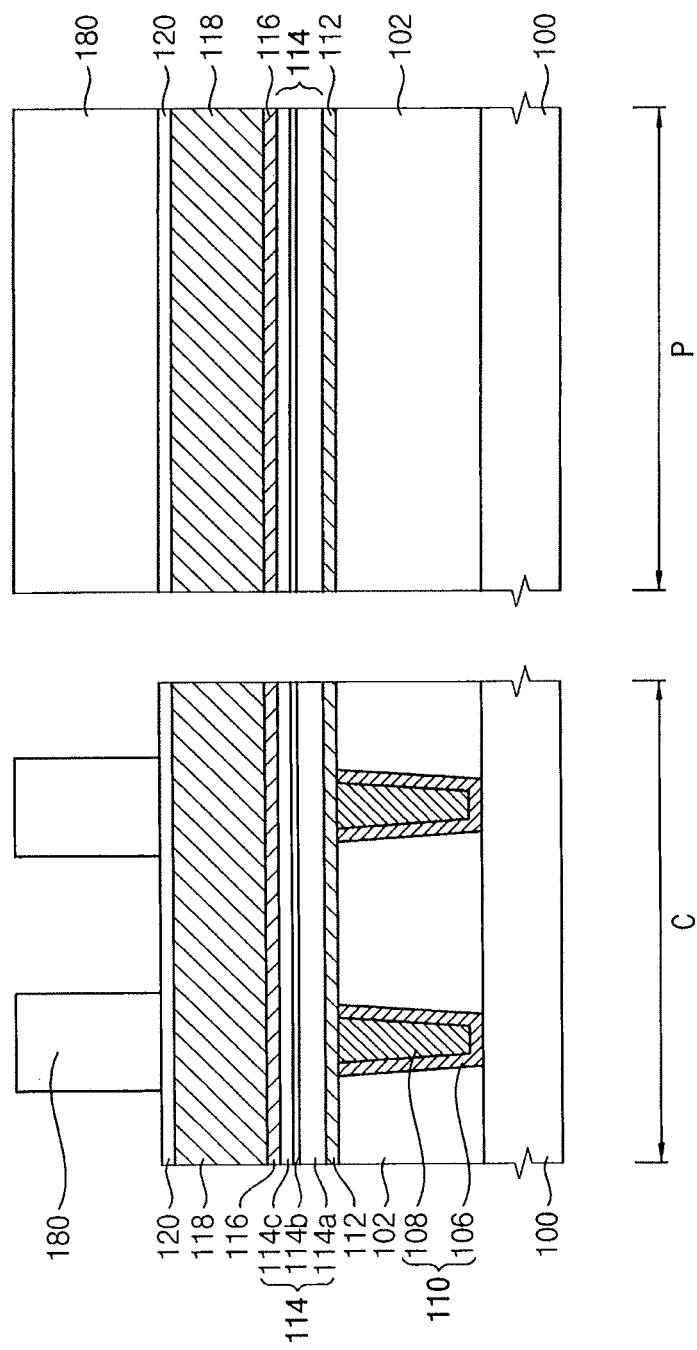
FIG. 25 illustrates a cross-sectional view of stages in a method of manufacturing a MRAM device in accordance with example embodiments.

FIG. 25 is a cross-sectional view illustrating a method of manufacturing a MRAM device in accordance with example embodiments. The method may be substantially the same as the method of manufacturing the MRAM device illustrated with reference to FIGS. 2 to 13, except for forming the first hard mask by embossing process.

Referring to FIG. 25, the first insulating interlayer 102 may be formed on the substrate 100, and the lower electrode contact 110 may be formed through the first insulating interlayer 102.

The lower electrode layer 112, the MTJ layer 114, the middle electrode layer 116, the upper electrode layer 118, and the first adhesion layer 120 may be sequentially formed on the first insulating interlayer 102 and the lower electrode contact 110. Then, a first hard mask layer, may be formed on the first adhesion layer 120, and the first hard mask layer may be patterned by photolithography to form the first hard mask 180.

The first hard mask 180 in the cell region C may have a pillar shape facing, e.g., overlapping, the lower electrode contact 110 in a vertical direction. Also, the first hard mask 180 in the peripheral region P may cover an entire upper surface of the first adhesion layer 120 in the peripheral region P. Thereafter, processes substantially the same as or similar to those illustrated with reference to FIGS. 9 to 13 may be performed to form the MRAM device shown in FIG. 1.

Figure 26:
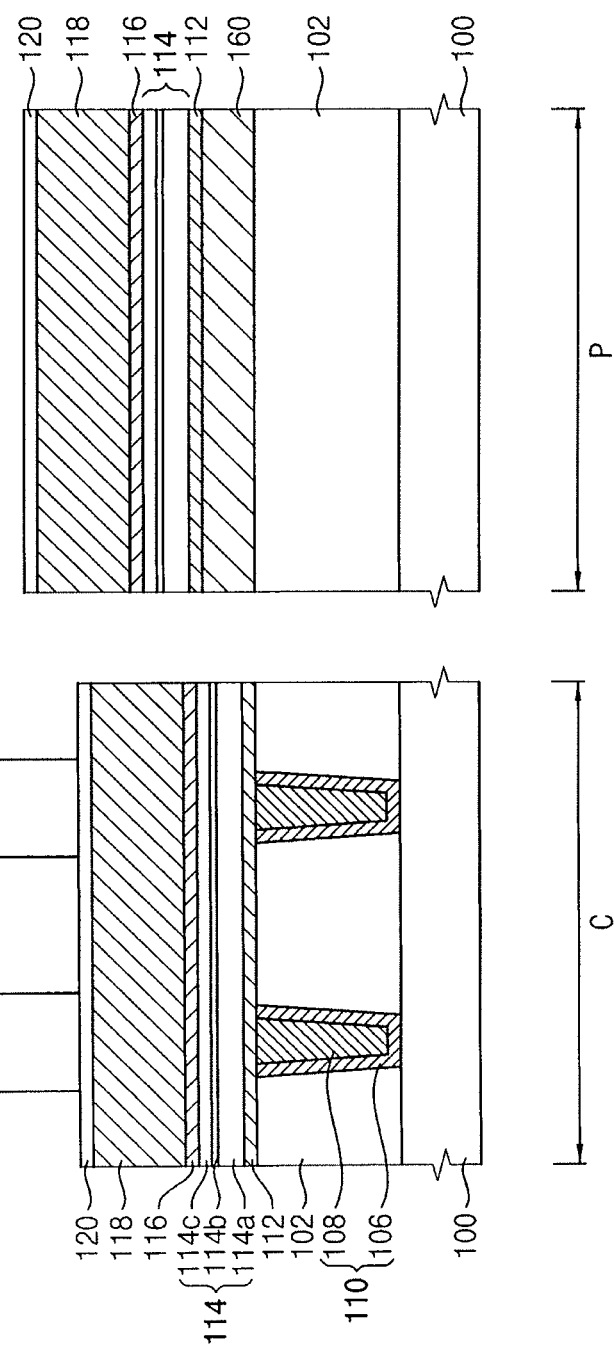
FIG. 26 illustrates a cross-sectional view of stages in a method of manufacturing a MRAM device in accordance with example embodiments.

FIG. 26 is a cross-sectional view illustrating a method of manufacturing a MRAM device in accordance with example embodiments. The method may be substantially the same as the method of manufacturing the MRAM device illustrated with reference to FIGS. 14 to 24, except for forming the first hard mask by embossing process.

Referring to FIG. 26, the first insulating interlayer 102 may be formed on the substrate 100, and the lower electrode contact 110 may be formed through the first insulating interlayer 102.

Then, the processes substantially the same as or similar to those illustrated with reference to FIGS. 14 to 16 may be performed to form the preliminary electrode layer 160 on the first insulating interlayer 102 in the peripheral region P.

The lower electrode layer 112, the MTJ layer 114, the middle electrode layer 116, and the upper electrode layer 118 may be formed on the first insulating interlayer 102, the lower electrode contact 110, and the preliminary electrode layer 160. A first hard mask layer may be formed on the first adhesion layer 120, and the first hard mask layer may be patterned by a photolithography process to form a first hard mask 182.

The first hard mask 182 may be formed only in the cell region C, and may not be formed in the peripheral region P. The first hard mask 182 in the cell region C may have a pillar shape that may be faced with the lower electrode contact 110 in a vertical direction. Also, an upper surface of the first adhesion layer 120 may be exposed in the peripheral region P. Thereafter, processes substantially the same as or similar to those illustrated with reference to FIGS. 23 and 24 and processes substantially the same as or similar to those illustrated with reference to FIGS. 11 to 13 may be performed to form the MRAM device shown in FIG. 1.

Figure 27:
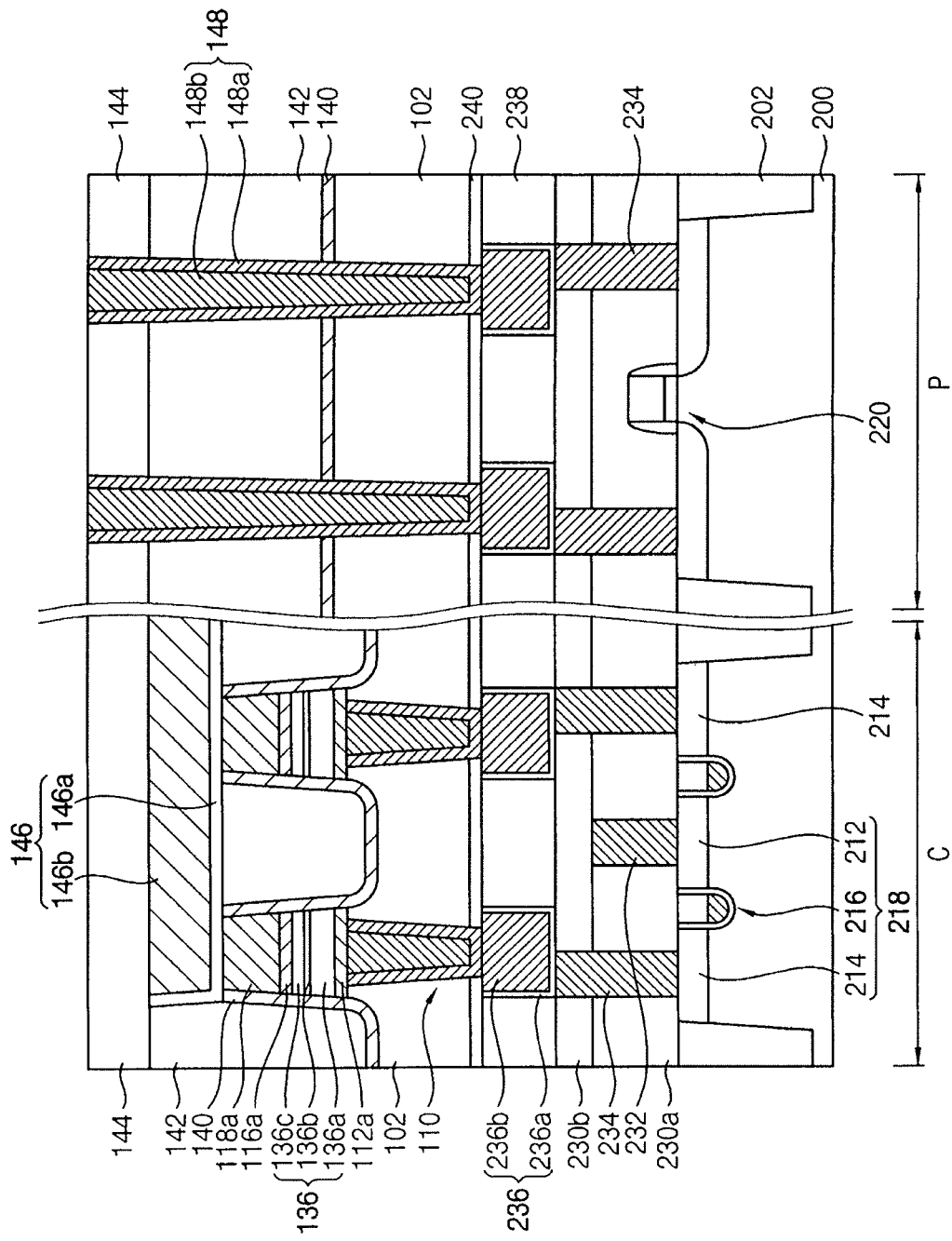
FIG. 27 illustrates a cross-sectional view of a MRAM device in accordance with example embodiments.

Hereinafter, a MRAM device including transistors and lower wirings on a substrate will be described with reference to FIG. 27. FIG. 27 a cross-sectional view illustrating a MRAM device in accordance with example embodiments.

Referring to FIG. 27, a substrate 200 may include a cell region C and a peripheral region P. An isolation layer 202 may be formed at the substrate 200, and thus an active region and a field region may be defined in the substrate 200.

Cell transistors 218 may be formed on the substrate 200 of the cell region C. In example embodiments, the cell transistors 218 may be a buried gate transistor in which a gate 216 may be formed within a trench of the substrate 200. The gate 216 may extend in a first direction to have a line shape. First and second impurity regions 212 and 214 may be formed at adjacent to sidewalls of the gate 216, respectively. In some example embodiments, the cell transistors 218 may be a planar type transistor or a fin type transistor.

A peripheral circuit transistor 220 may be formed on the substrate 200 of the peripheral region P. In example embodiments, the peripheral circuit transistor 220 may be a planar type transistor.

A first lower insulating interlayer 230a and a second lower insulating interlayer 230b may be formed on the substrate 200 to cover the cell transistor 218 and the peripheral circuit transistors 220. A source line 232 may extend through the first lower insulating interlayer 230a, and may contact the first impurity region 212. Each of the contact plugs 234 may extend through the first and second lower insulating interlayers 230a and 230b in the cell region C and the peripheral region P, and may electrically connected with the second impurity region 214 or the peripheral circuit transistor 220.

A wiring structure 236 may be formed on each of the contact plugs 234. Also, a third lower insulating interlayer 238 may be formed between the wiring structures 236.

The wiring structure 236 may include a contact or a conductive line extending through the third lower insulating interlayer 238. The wiring structure 236 may include a barrier layer 236a including, e.g., titanium, titanium nitride, tantalum, tantalum nitride, and a metal pattern 236b formed on the barrier layer 236a. The barrier layer 236a may surround a sidewall and a bottom of the metal pattern 236b. The metal pattern 236b may include, e.g., tungsten, copper, aluminum, etc. Upper surfaces of the third lower insulating interlayer 238 and the wiring structure 236 may be coplanar with each other.

An etch stop layer 240 may be formed on the third lower insulating interlayer 238 and the wiring structure 236. The etch stop layer 240 may include nitrides such as silicon nitride (SiN), silicon oxynitride (SiON), silicon carbonitride (SiCN), silicon oxynitride (SiOCN), etc.

A first insulating interlayer 102, a lower electrode contact 110, a lower electrode 112a, an MTJ structure 136, a middle electrode 116a, an upper electrode 118a, and a capping layer (not shown) may be formed on the etch stop layer 240. Further, a second insulating interlayer 142, a bit line 146, a third insulating interlayer 144, a via contact 148, and the like may be formed.

In example embodiments, a structure formed on the etch stop layer 240 may be substantially the same as that illustrated with reference to FIG. 1. The lower electrode contact 110 in the cell region C may contact the wiring structure 236 through the etch stop layer. Also, the via contact 148 in the peripheral region P may contact the wiring structure 236 through the etch stop layer 240.

Figure 28:
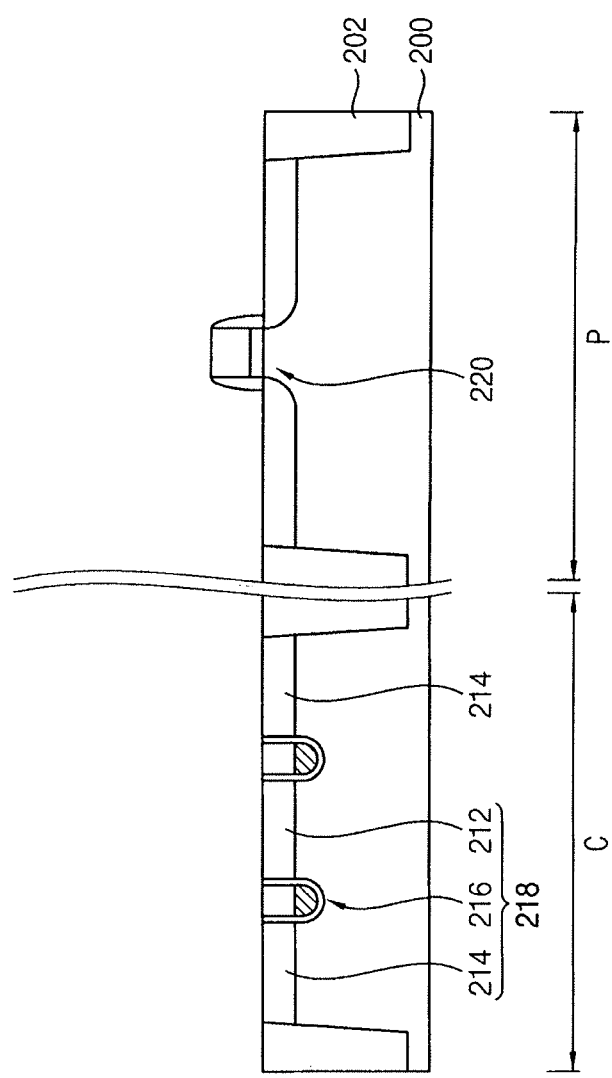
FIGS. 28 to 30 illustrate cross-sectional views of stages in a method of manufacturing a MRAM device in accordance with example embodiments.
Figure 29:
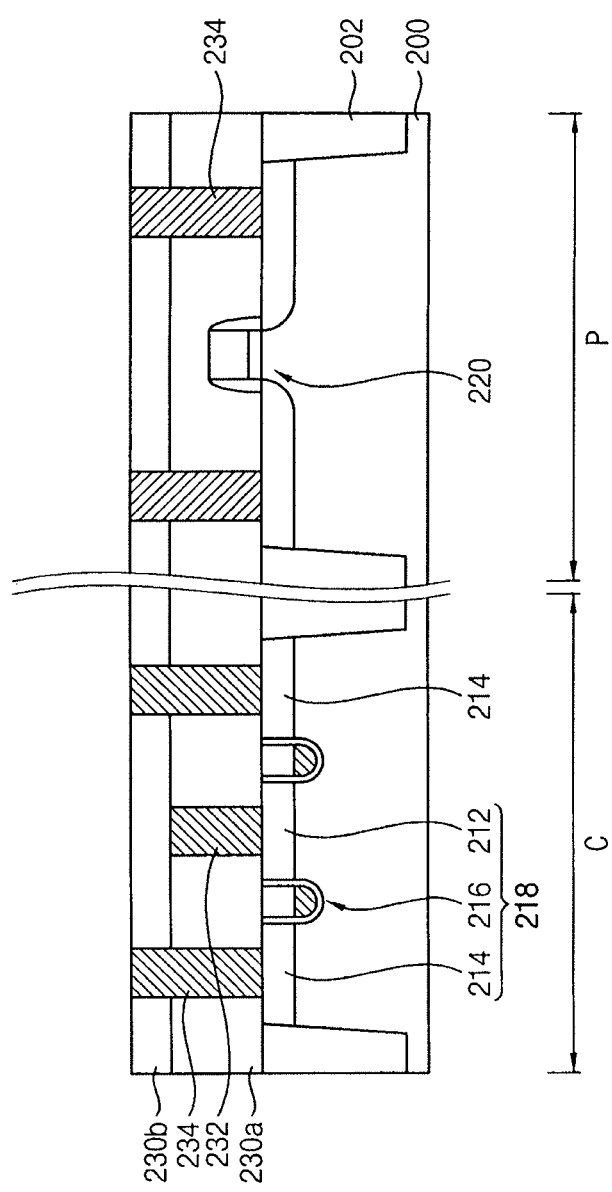
Figure 30:
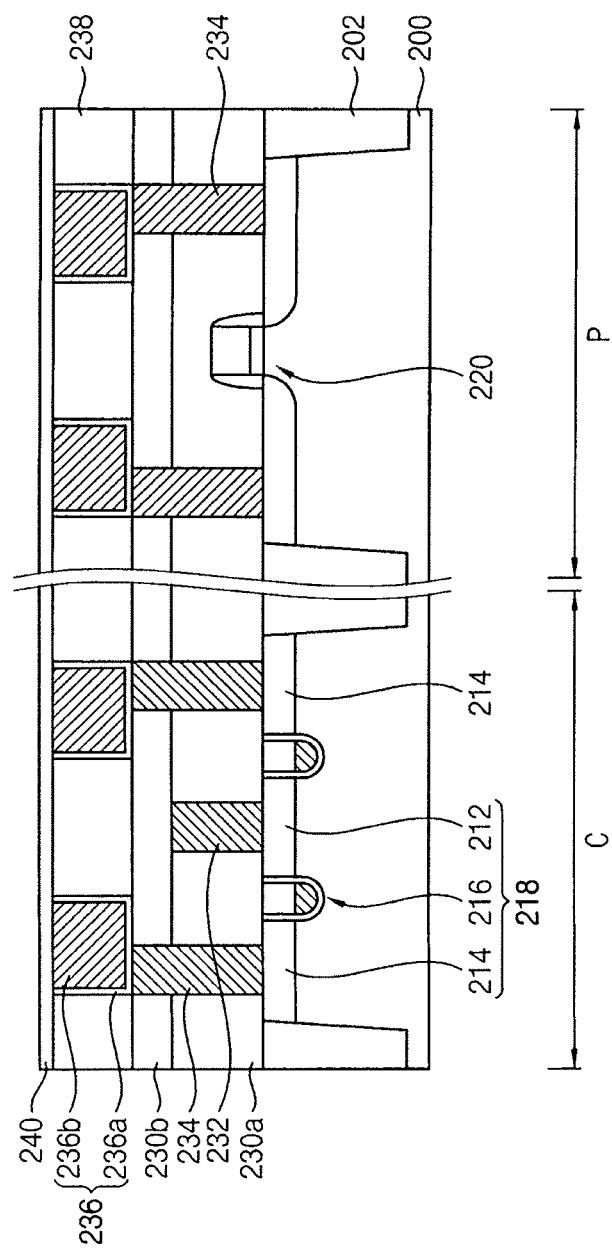

FIGS. 28 to 30 are cross-sectional views illustrating stages in a method of manufacturing a MRAM device in accordance with example embodiments.

Referring to FIG. 28, an isolation layer 202 may be formed on a substrate 200 including a cell region C and a peripheral region P, and thus the substrate 200 is divided into an active region and a field region. The isolation layer 202 may be formed by shallow trench isolation (STI) process.

Cell transistors 218 may be formed on the substrate 200 of the cell region C. Further, the peripheral circuit transistors 220 may be formed on the substrate 100 of the peripheral region P.

In example embodiments, a trench may be formed at the substrate 100 of the cell region C, a gate 216 may be formed in the trench. A first impurity region 212 and a second impurity region 214 may be formed at the substrate on sides of the gate 216. Thus, the cell transistors 218 may be formed on the substrate 100 of the cell region C. In this case, each of the cell transistors 218 may be a buried gate type transistor.

In example embodiments, the peripheral circuit transistor 220 may be a planar transistor.

Referring to FIG. 29, a first lower insulating interlayer 230a may be formed on the substrate 200. Source lines 232 may be formed on the first impurity region 212 through the first lower insulating interlayer 230a.

A second lower insulating interlayer 230b may be formed on the first lower insulating interlayer 230a and the source lines 232. A contact plug (not shown) may be electrically connected to the second impurity region 214 and the peripheral circuit transistor 220 through the first and second lower insulating interlayer 230a and 230b in the cell region C and the peripheral region P.

Referring to FIG. 30, a third lower insulating interlayer 238 may be formed on the second lower insulating interlayer 230b. A wiring structure 236 may be formed on the contact plug 234 through the third lower insulating interlayer 238. The etch stop layer 240 may be formed on the third lower insulating interlayer 238 and the wiring structure 236.

The wiring structure 236 may include a barrier layer 236a and a metal pattern 236b. In example embodiments, the wiring structures 236 may be formed by a dual damascene process or a single damascene process.

In example embodiments, the etch stop layer 240 may be formed of silicon nitride or silicon oxynitride by a CVD process or an ALD process.

Referring to FIG. 27 again, the structure shown in FIG. 1 may be formed on the etch stop layer 240 and the wiring structure 236. In this case, the lower electrode contact 110 in the cell region C may contact the wiring structure 236 through the etch stop layer 240. The via contact 148 in the peripheral region P may contact the wiring structure 236 through the etch stop layer 240. Therefore, the MRAM device shown in FIG. 27 may be manufactured.

In example embodiments, the structure shown in FIG. 27 may be formed on the etch stop layer 240 and the wiring structure 236 by performing processes substantially the same as or similar to those illustrated with reference to FIGS. 2 to 13.

In some example embodiments, the structure shown in FIG. 27 may be formed on the etch stop layer 240 and the wiring structure 236 by performing processes substantially the same as or similar to those illustrated with reference to FIGS. 14 to 24, processes substantially the same as or similar to those illustrated with reference to FIG. 25, or processes substantially the same as or similar to those illustrated with reference to FIG. 26.

The MRAM device in accordance with example embodiments may be used as a memory included in an electronic product, e.g., a mobile device, a memory card, and a computer, etc.

By way of summation and review, a difference of etching rates between a cell region and a peripheral region of the MRAM device may occur during etching of the MTJ in the cell region, so that a step difference between the cell region and the peripheral region may be largely generated. In contrast, in the MRAM according to embodiments, the upper surface of the first insulating interlayer in the peripheral region may be higher than the upper surface of the first insulating interlayer in the cell region. Thus, a step difference between the cell region and the peripheral region may be decreased. As the reliability defect and the wiring defect due to the step difference is reduced, the MRAM may have improved characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A MRAM device, comprising:
a first insulating interlayer on a substrate including a cell region and a peripheral region;
lower electrode contacts extending through the first insulating interlayer of the cell region;
a first structure on each of the lower electrode contacts, the first structure including a lower electrode, a magnetic tunnel junction structure, and an upper electrode sequentially stacked; and
a capping layer covering surfaces of the first insulating interlayer and the first structure in the cell and peripheral regions;
wherein an upper surface of the capping layer on the first insulating interlayer in the peripheral region is higher than an upper surface of the capping layer on the first insulating interlayer between the first structures in the cell region.

2. The MRAM device as claimed in claim 1, wherein an upper surface of the first insulating interlayer in the peripheral region is higher than an upper surface of the first insulating interlayer between the first structures in the cell region.

3. The MRAM device as claimed in claim 1, wherein an upper surface of the first insulating interlayer between the first structures in the cell region is lower than an upper surface of the lower electrode contact.

4. The MRAM device as claimed in claim 1, wherein an upper surface of the first insulating interlayer in the peripheral region is coplanar with or lower than an upper surface of the lower electrode contact.

5. The MRAM device as claimed in claim 1, wherein an upper surface of the first insulating interlayer in the peripheral region is substantially flat.

6. The MRAM device as claimed in claim 1, wherein the capping layer is conformal on the surfaces of the first insulating interlayer and the first structure in the cell and peripheral regions, so that the capping layer has a uniform thickness.

7. The MRAM device as claimed in claim 1, wherein the capping layer includes silicon nitride or silicon oxynitride.

8. The MRAM device as claimed in claim 1, further comprising:
a second insulating interlayer on the capping layer in the cell and peripheral regions to fill a gap between the first structures; and
a via contact extending through the second insulating interlayer, the capping layer, and the first insulating interlayer in the peripheral region.

9. The MRAM device as claimed in claim 8, further comprising a lower wiring and a lower insulating interlayer on the substrate, the via contact being electrically connected with the lower wiring.

10. A MRAM device, comprising:
a first insulating interlayer on a substrate including a cell region and a peripheral region;
lower electrode contacts extending through the first insulating interlayer of the cell region; and
a first structure on each of the lower electrode contacts, the first structure including a lower electrode, a magnetic tunnel junction structure, and an upper electrode sequentially stacked,
wherein an upper surface of the first insulating interlayer in the peripheral region is higher than an upper surface of the first insulating interlayer between the first structures in the cell region.

11. The MRAM device as claimed in claim 10, further comprising a capping layer covering surfaces of the first insulating interlayer and the first structure in the cell and peripheral regions.

12. The MRAM device as claimed in claim 11, wherein an upper surface of the capping layer on the first insulating interlayer in the peripheral region is higher than an upper surface of the capping layer on the first insulating interlayer between the first structures in the cell region.

13. The MRAM device as claimed in claim 11, wherein an upper surface of the first insulating interlayer between the first structures in the cell region is lower than an upper surface of the lower electrode contact.

14. The MRAM device as claimed in claim 11, further comprising:
a second insulating interlayer on the capping layer in the cell and peripheral regions to fill a gap between the first structures; and
a via contact extending through the second insulating interlayer, the capping layer, and the first insulating interlayer in the peripheral region.

15. The MRAM device as claimed in claim 14, further comprising a bit line in the second insulating interlayer, the bit line contacting the upper electrode of the first structure.

16. A MRAM device, comprising:
a first insulating interlayer on a substrate including a cell region and a peripheral region;
lower electrode contacts extending through the first insulating interlayer of the cell region;
a first structure on each of the lower electrode contacts, the first structure including a lower electrode, a magnetic tunnel junction structure, and an upper electrode sequentially stacked; and
a capping layer covering surfaces of the first insulating interlayer and the first structure in the cell and peripheral regions, the capping layer having a uniform thickness,
wherein an upper surface the first insulating interlayer in the cell region is lower than an upper surface the first insulating interlayer in the peripheral region.

17. The MRAM device as claimed in claim 16, wherein an upper surface of the capping layer on the first insulating interlayer in the peripheral region is higher than an upper surface of the capping layer on the first insulating interlayer between the first structures in the cell region.

18. The MRAM device as claimed in claim 16, wherein an upper surface of the first insulating interlayer between the first structures in the cell region is lower than an upper surface of the lower electrode contact.

19. The MRAM device as claimed in claim 16, wherein an upper surface of the first insulating interlayer in the peripheral region is coplanar with or lower than an upper surface of the lower electrode contact.

20. The MRAM device as claimed in claim 16, wherein an upper surface of the first insulating interlayer in the peripheral region is substantially flat.

* * * * *